United States Patent
Eguchi et al.

(10) Patent No.: US 9,997,621 B2
(45) Date of Patent: Jun. 12, 2018

(54) SEMICONDUCTOR DEVICE AND MANUFACTURING METHOD OF THE SAME

(71) Applicant: Renesas Electronics Corporation, Tokyo (JP)

(72) Inventors: Satoshi Eguchi, Ibaraki (JP); Hitoshi Matsuura, Ibaraki (JP); Yuya Abiko, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days. days.

(21) Appl. No.: 15/355,469

(22) Filed: Nov. 18, 2016

(65) Prior Publication Data

US 2017/0154984 A1 Jun. 1, 2017

(30) Foreign Application Priority Data

Nov. 26, 2015 (JP) ................................. 2015-230394

(51) Int. Cl.
*H01L 29/739* (2006.01)
*H01L 21/324* (2006.01)
(Continued)

(52) U.S. Cl.
CPC ........ *H01L 29/7396* (2013.01); *H01L 21/265* (2013.01); *H01L 21/324* (2013.01); *H01L 29/0634* (2013.01); *H01L 29/0688* (2013.01); *H01L 29/32* (2013.01); *H01L 29/404* (2013.01); *H01L 29/6634* (2013.01); *H01L 29/66333* (2013.01); *H01L 29/1095* (2013.01)

(58) Field of Classification Search
CPC . H01L 29/7396; H01L 29/0688; H01L 29/32; H01L 29/66333; H01L 21/265; H01L 21/324

USPC .................................. 257/139; 438/268, 289
See application file for complete search history.

(56) References Cited

U.S. PATENT DOCUMENTS

| 2005/0116313 | A1* | 6/2005 | Lee | H01L 29/7802 257/500 |
| 2010/0187598 | A1* | 7/2010 | Endo | H01L 29/7394 257/329 |

(Continued)

OTHER PUBLICATIONS

Wataru Saito et al., "Influence of Carrier Lifetime Control Process in Superjunction MOSFET Characteristics" Proceedings of the 26th International Symposium on Semiconductor Device & IC's, Jun. 15-19, 2014, pp. 87-90, Waikolao, Hawaii.

*Primary Examiner* — Cuong Q Nguyen
*Assistant Examiner* — Tong-Ho Kim
(74) *Attorney, Agent, or Firm* — Sughrue Mion, PLLC

(57) ABSTRACT

Reduction of power consumption of a semiconductor device is aimed. The semiconductor device includes a cell region where a vertical power MOSFET is formed and an intermediate region surrounding the cell region. In each of the cell region and the intermediate region, a plurality of p-type column regions and a plurality of n-type column regions are alternately formed. The n-type column region arranged in the cell region has a defect region formed therein, whereas the n-type column region arranged in the intermediate region does not have the defect region. A defect density in the n-type column region arranged in the cell region is larger than that in the n-type column region arranged in the intermediate region.

15 Claims, 33 Drawing Sheets

(51) Int. Cl.
*H01L 29/66* (2006.01)
*H01L 21/265* (2006.01)
*H01L 29/06* (2006.01)
*H01L 29/32* (2006.01)
*H01L 29/40* (2006.01)
H01L 29/10 (2006.01)

(56) References Cited

U.S. PATENT DOCUMENTS

| | | | | |
|---|---|---|---|---|
| 2011/0018055 A1* | 1/2011 | Ohta | ............... | H01L 29/0634 |
| | | | | 257/329 |
| 2012/0241899 A1* | 9/2012 | Kobayashi | .......... | H01L 29/0615 |
| | | | | 257/487 |
| 2013/0026560 A1* | 1/2013 | Onishi | ............... | H01L 29/0634 |
| | | | | 257/329 |
| 2014/0242769 A1* | 8/2014 | Yamada | ............ | H01L 29/66477 |
| | | | | 438/289 |

* cited by examiner

SEMICONDUCTOR DEVICE AND MANUFACTURING METHOD OF THE SAME

CROSS-REFERENCE TO RELATED APPLICATIONS

The disclosure of Japanese Patent Application No. 2015-230394 filed on Nov. 26, 2015 including the specification, drawings and abstract is incorporated herein by reference in its entirety.

BACKGROUND

The present invention relates to a semiconductor device and a manufacturing method of the same, and can be suitably used for a power semiconductor device and a manufacturing method thereof, for example.

In a vertical power MOSFET that is a power semiconductor device, employment of a superjunction structure has been studied in order to reduce an on-state resistance while keeping a breakdown voltage.

For example, the disclosure of Wataru Saito et al., "Influence of Carrier Lifetime Control Process in Superjunction MOSFET Characteristics", Proceedings of the 26th International Symposium on Semiconductor Device & IC's, Jun. 15-19, 2014 Waikolao, Hi. aims to improve a recovery speed of a built-in diode of a MOSFET having a superjunction structure, and in FIG. 1 a technique is disclosed that radiates an electron beam into a substrate or a technique that dopes the substrate with Pt in order to control a lifetime of carriers.

SUMMARY

The inventors of the present application have been studying a semiconductor device including a vertical power MOSFET of a superjunction structure, and have found that there is further room of improvement related to its structure and its manufacturing method in order to improve the performance thereof.

In the semiconductor device the inventors of the present application have been studying, an electron beam is radiated to the inside of a semiconductor wafer on which the vertical power MOSFET is formed from a major surface or a back surface of the semiconductor wafer in order to improve switching characteristics of the vertical power MOSFET. When the radiation amount of this electron beam is increased, the number of defects formed inside the semiconductor wafer increases and the lifetime of the carriers can be reduced. Therefore, the recovery speed of the built-in diode can be increased.

However, the electron beam travels through the semiconductor wafer, thus causing generation of the defects over the entire region of the semiconductor wafer in a thickness direction and a plane direction. It is difficult to form the defects selectively in the thickness direction or the plane direction of the semiconductor wafer. Thus, the defects are also present in an interface of a pn junction forming the vertical power MOSFET, The studies by the inventors of the present application have revealed that when the radiation amount of the electron beam is increased in order to improve the recovery speed of the built-in diode, a leak current between a source and a drain of the vertical power MOSFET, for example, is increased. That is, it has been revealed that even when a switching rate of the vertical power MOSFET is improved by improvement of the recovery speed of the built-in diode, overall power consumption cannot be reduced because of the increase of the leak current when the vertical power MOSFET is off.

In other words, further reduction of the power consumption is desired in the semiconductor device.

Other problems and novel features will be apparent from the description of this specification and the accompanying drawings.

According to an embodiment of the present application, a semiconductor device includes a cell region where a vertical power MOSFET is formed and an intermediate region surrounding the cell region. In each of the cell region and the intermediate region, a plurality of p-type column regions and a plurality of n-type column regions are alternately formed. The n-type column region arranged in the cell region has a defect region and n-type column region arranged in the intermediate region has no defect region. A defect density of the n-type column region arranged in the cell region is larger than a defect density of the n-type column region arranged in the intermediate region.

According to a semiconductor device described in the following typical embodiment disclosed in the present application, it is possible to reduce power consumption in the semiconductor device.

DETAILED DESCRIPTION

Figure 1:
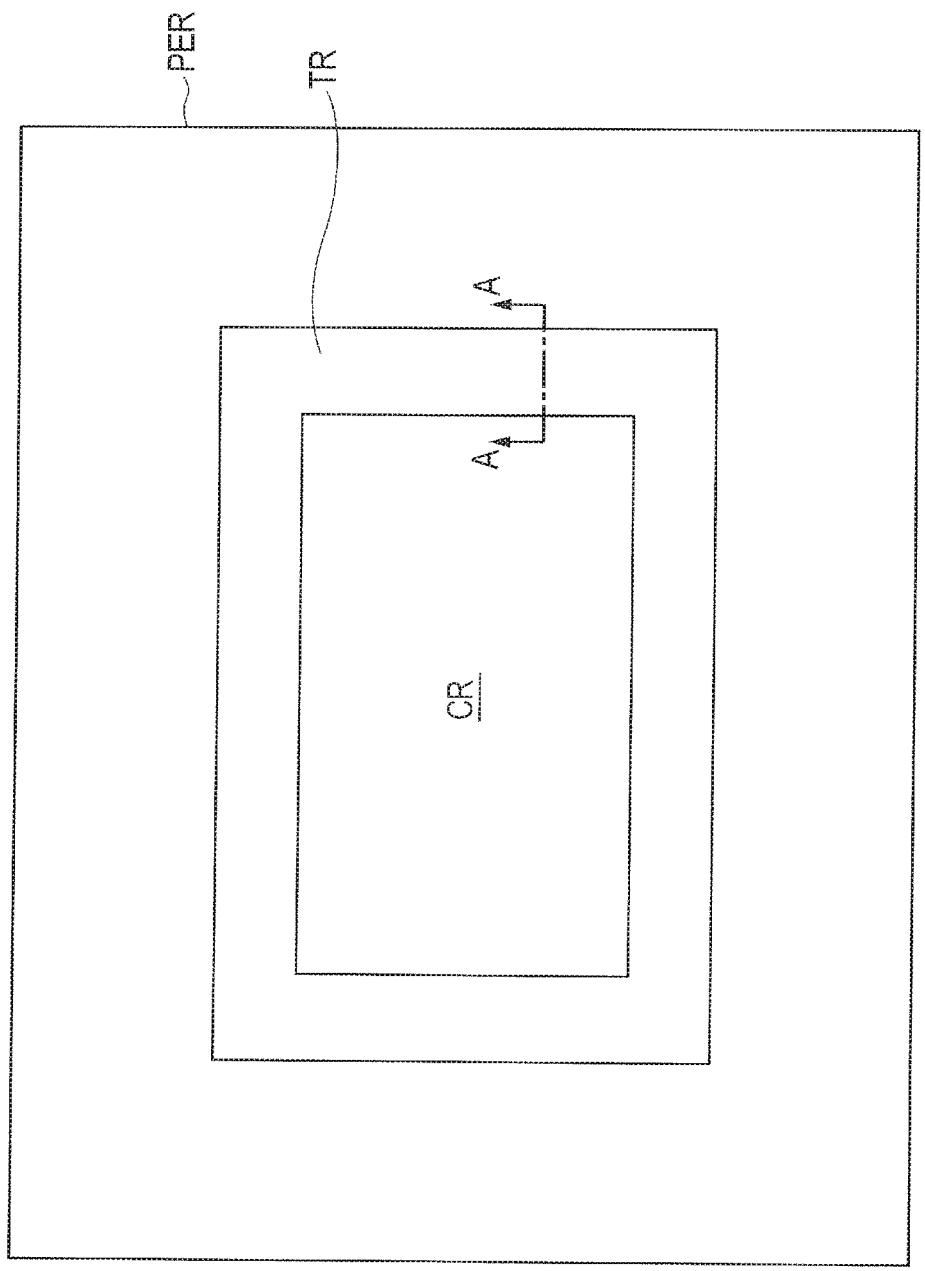
FIG. 1 is a plan view schematically showing a configuration of a semiconductor device according to a first embodiment.

The following embodiments will be described while being divided into a plurality of sections or embodiments, if necessary for the sake of convenience. However, unless otherwise specified, these are not independent of each other, but are in a relation such that one is a modified example, an application example, the detailed explanation, supplemental explanation, or the like of a part or the whole of the other. Further, in the following embodiments, when a reference is made to the number of elements and the like (including number, numerical value, amount, range and the like), the number of elements is not limited to a specific number, but may be greater than or less than the specific number, unless otherwise specified, or except the case where that number is apparently limited to the specific number in principle, or except for other cases.

Further, in the following embodiments, the constitutional elements (including element steps or the like) are not always essential, unless otherwise specified, or except the case where they are apparently considered essential in principle, or except for other cases. Similarly, in the following embodiments, when a reference is made to the shapes, positional relationships, or the like of the constitutional elements or the like, it is understood that they include ones substantially analogous or similar to the shapes or the like, unless otherwise specified, or unless otherwise considered apparently in principle, or except for other cases. This is also applied to the foregoing numbers (including number, numerical values, amount, range and the like).

Embodiments are described in detail below, referring to the drawings. In all the drawings for explaining the embodiments, members having the same functions are labeled with the same or related reference signs, and the redundant description thereof is omitted. In a case where there are a plurality of similar members (parts), a symbol may be added to a general reference sign to denote an individual or specific part. Further, in the following embodiments, the description of the same or similar parts is not repeated in principle, except when necessary.

In addition, in the drawings used in the embodiments, hatching may be omitted even in a cross-sectional view for ease of understanding of the drawing. Also, hatching may be provided even in a plan view for ease of understanding of the drawing.

Further, in a cross-sectional view and a plan view, the size of each part does not correspond to that in an actual device. A specific part may be displayed to be relatively larger for ease of understanding of the drawings Also in a case where a cross-sectional view and a plan view correspond to each other, a specific part may be displayed to be relatively larger for ease of understanding of the drawings.

First Embodiment

[Description of Structure]

Figure 2:
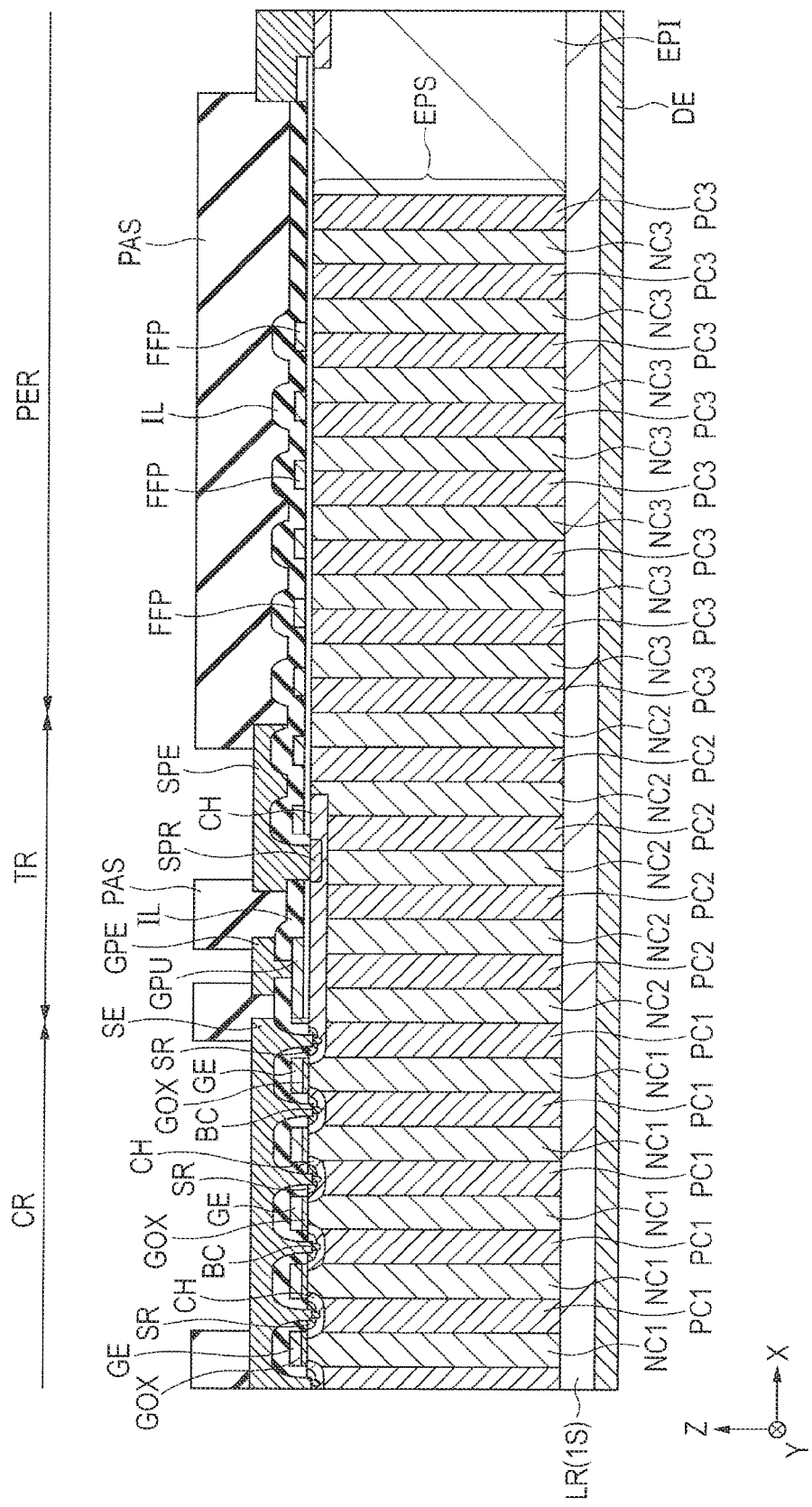
FIG. 2 is a cross-sectional view showing the configuration of the semiconductor device according to the first embodiment.
Figure 3:
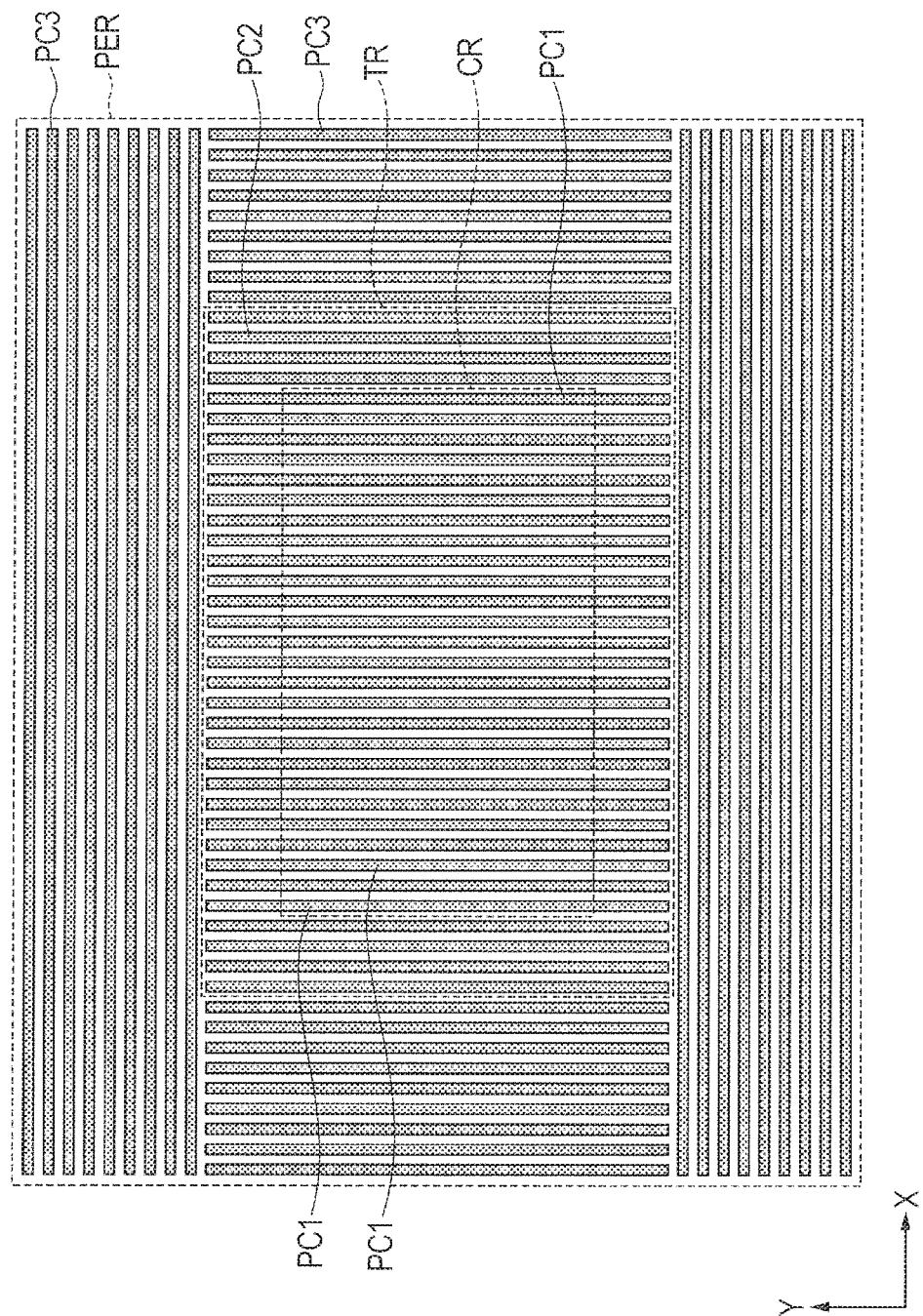
FIG. 3 is a plan view showing a configuration of a p-type column region of the semiconductor device according to the first embodiment.
Figure 4:
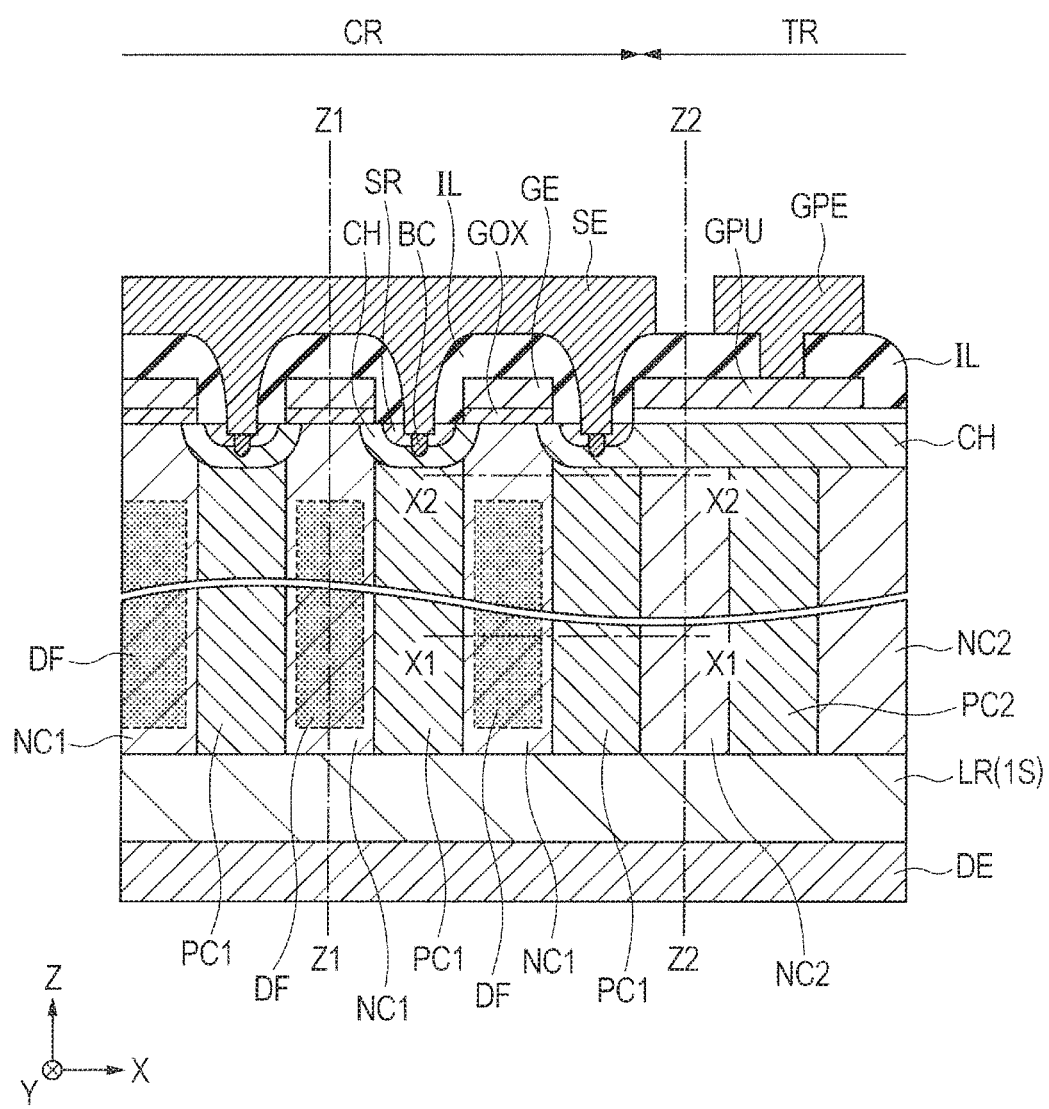
FIG. 4 is a cross-sectional view of a main portion of the semiconductor device shown in FIG. 2, while being enlarged.
Figure 5A:
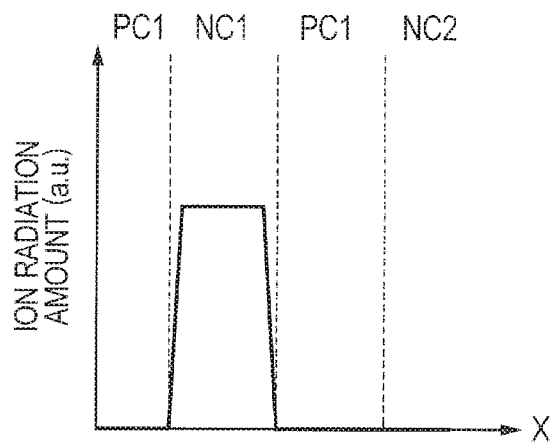
FIGS. 5A, 5B, and 5C respectively show an ion radiation amount, a resistivity, and a hole lifetime in a section taken along line X1-X1 in FIG. 4.
Figure 5B:
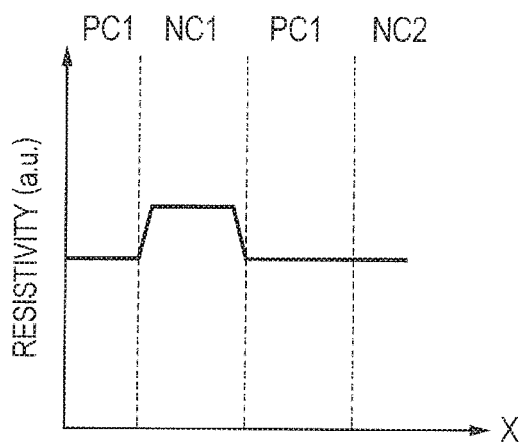
Figure 5C:
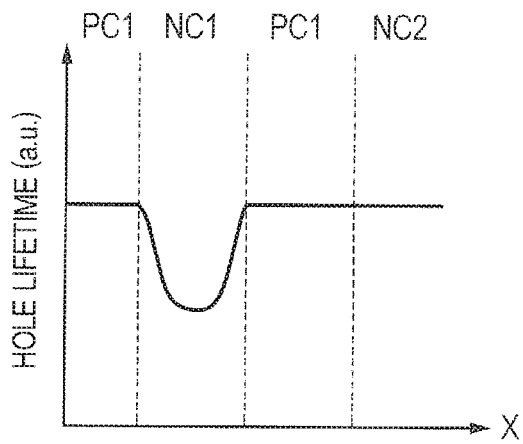
Figure 6A:
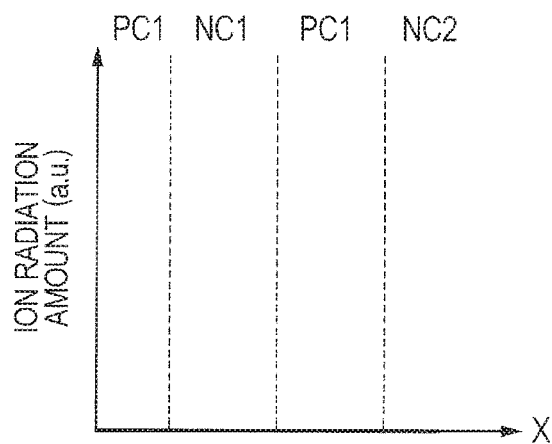
FIGS. 6A, 6B, and 6C respectively show the ion radiation amount, the resistivity, and the hole lifetime in a section taken along line X2-X2 in FIG. 4.
Figure 6B:
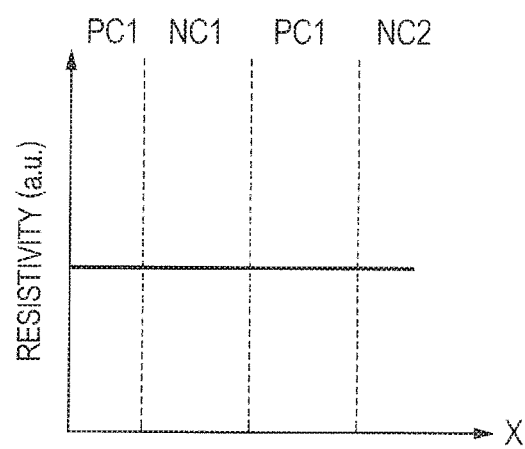
Figure 6C:
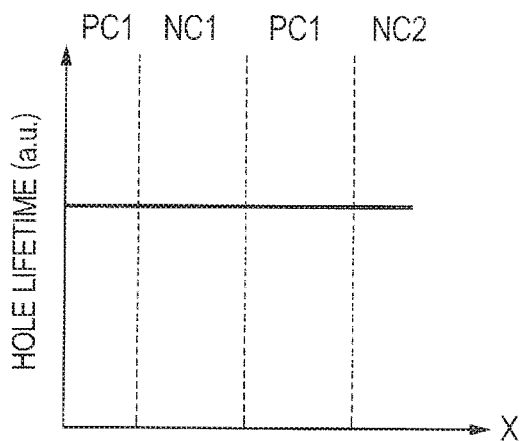
Figure 7A:
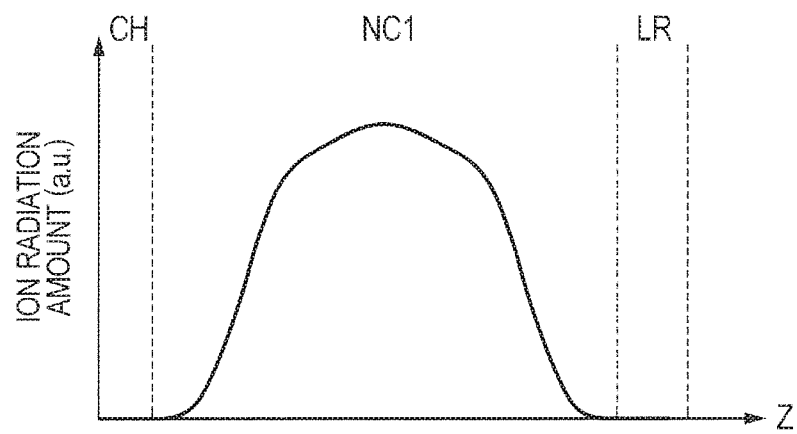
FIGS. 7A, 7B, and 7C respectively show the ion radiation amount, the resistivity, and the hole lifetime in a section taken along line Z1-Z1 in FIG. 4.
Figure 7B:
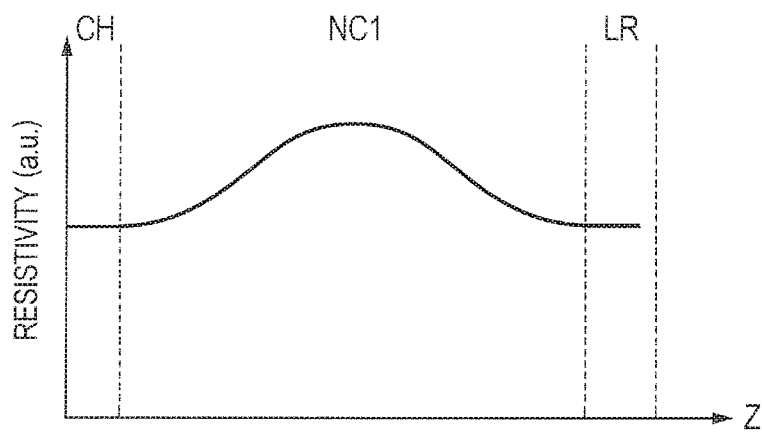
Figure 7C:
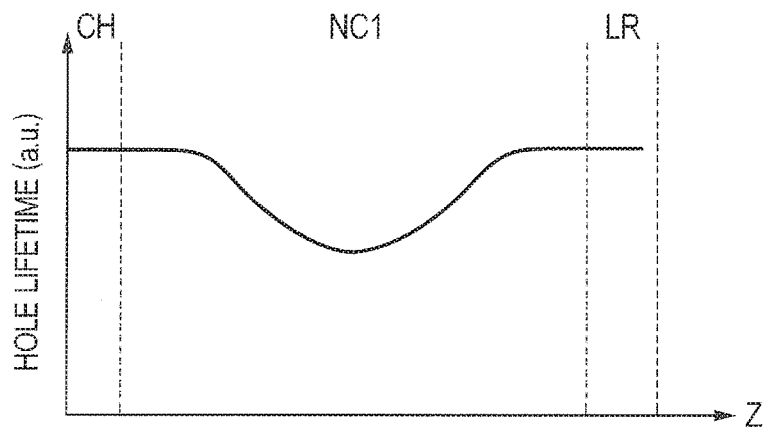
Figure 8A:
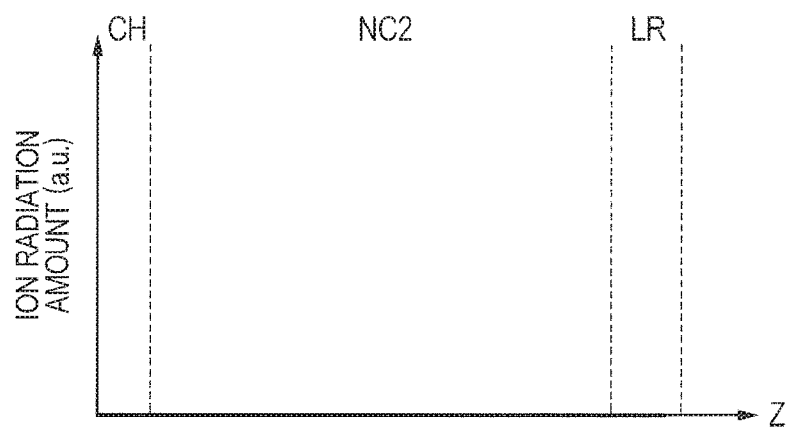
FIGS. 8A, 8B, and 8C respectively show the ion radiation amount, the resistivity, and the hole lifetime in a section taken along line Z2-Z2 in FIG. 4.
Figure 8B:
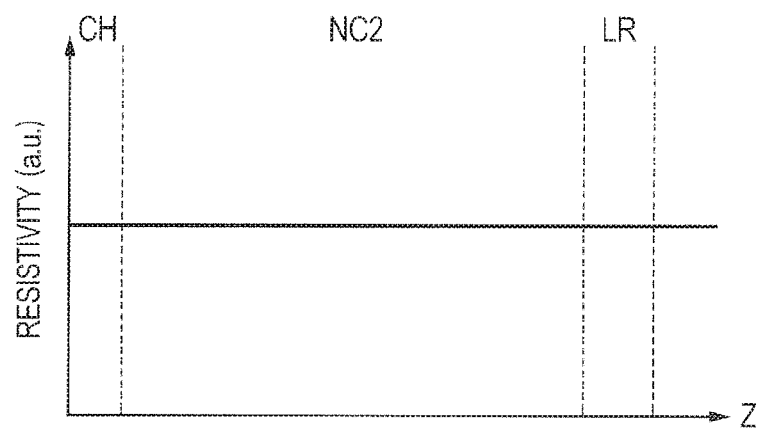
Figure 8C:
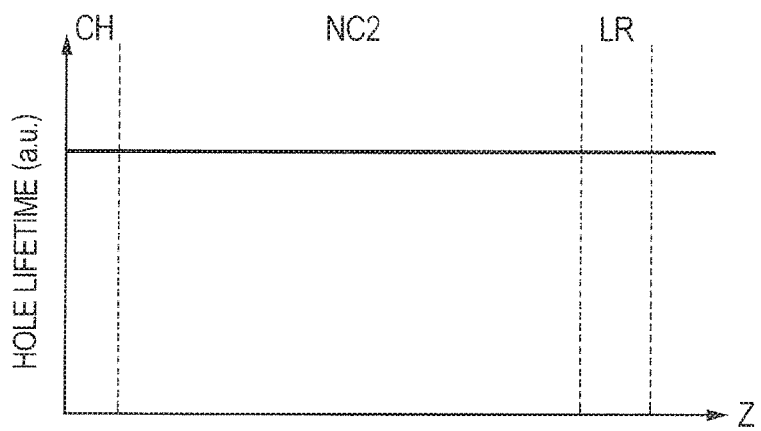

FIG. 1 is a plan view schematically showing a configuration of a semiconductor device according to the present embodiment. FIG. 2 is a cross-sectional view showing the configuration of the semiconductor device according to the present embodiment. A section shown in FIG. 2 corresponds to an A-A portion in FIG. 1, for example. FIG. 3 is a plan view of a p-type column region of the semiconductor device according to the present embodiment. FIG. 4 is a cross-sectional view of a main portion of the semiconductor device shown in FIG. 2, while being enlarged. FIGS. 5A, 5B, and 5C respectively Show an ion radiation amount, a resistivity, and a hole lifetime in a section taken along line X1-X1 in FIG. 4. FIGS. 6A, 6B, and 6C respectively show the ion radiation amount, the resistivity, and the hole lifetime in a section taken along line X2-X2 in FIG. 4. FIGS. 7A, 7B, and 7C respectively show the ion radiation amount, the resistivity, and the hole lifetime in a section taken along line Z1-Z1 in FIG. 4. FIGS. 8A, 8B, and 8C respectively show the ion radiation amount, the resistivity, and the hole lifetime in a section taken along line Z2-Z2 in FIG. 4. The semiconductor device according to the present embodiment includes a vertical power MOSFET (Metal Oxide Semiconductor Field Effect Transistor). The MOSFET may be also called a MISFET (Metal Insulator Semiconductor Field Effect Transistor).

As shown in FIG. 1, the shape of the semiconductor device of the present embodiment (a semiconductor chip) is rectangular in a plan view when seen from above. The semiconductor device of the present embodiment has a cell region CR, an intermediate region (a termination portion, a terminating portion) TR, and a peripheral region PER. The cell region CR is arranged at a center of the approximately rectangular semiconductor device, the intermediate region TR is arranged to surround the cell region CR from the outside, and the peripheral region PER is arranged to surround the intermediate region TR. The configuration of the semiconductor device in each of the regions is described below, referring to FIG. 2.

(1) Structure of Cell Region CR

As shown in FIG. 2, a power MOSFET is formed in the cell region CR. This power MOSFET is formed on a major surface of an epitaxial layer EPS on a semiconductor substrate 1S (corresponding to an n-type semiconductor region LR in FIG. 2). The epitaxial layer EPS is formed by a plurality of p-type column regions (also called p-type pillars or pillars) PC1 and a plurality of n-type column regions (also called n-type pillars or pillars) NC1. The p-type column regions PC1 and the n-type column regions NC1 are alternately arranged in X-direction. This structure in which the p-type column regions PC1 and the n-type column regions NC1 are periodically arranged is called a superjunction structure. As shown in FIG. 3, the shape of the p-type column region PC1 in a plan view when seen from above is a line shape (a rectangular shape having a long side extending in X-direction).

For example, the width (the dimension in X-direction) and the depth (the dimension in Y-direction) of the p-type column region PC1 are designed to be the same as the width (the dimension in X-direction) and the depth (the dimension in Y-direction) of the n-type column region NC1, respectively.

The n-type column region NC1 is columnar, for example, and is formed by a semiconductor region (the epitaxial layer) in which an n-type impurity, such as phosphorus (P) or arsenic (As), is introduced. The n-type impurity concentration in the n-type column region NC1 is $3.0 \times 10^{15}/cm^3$, for example. The n-type column regions NC1 and the semiconductor substrate 1S form a drain region of the power MOSFET. The n-type column region NC1 is sandwiched between two p-type column regions PC1. The n-type column regions NC1 are spaced from each other by the width (the dimension in X-direction) of the p-type column region PC1.

The p-type column region PC1 is columnar, for example, and is formed by a semiconductor region in which a p-type impurity, such as boron (B), is introduced. The p-type impurity concentration in the p-type column region PC1 is $3.0 \times 10^{15}/cm^3$, for example. The p-type column region PC1 is sandwiched between two n-type column regions NC1. The p-type column regions PC1 are spaced from each other by the width (the dimension in X-direction) of the n-type column region NC1.

On the major surface of this structure (the epitaxial layer EPS) in which the p-type column regions PC1 and the n-type column regions NC1 are periodically arranged, the power MOSFET is formed.

The power MOSFET includes a gate electrode GE arranged over the n-type column region NC1 via a gate insulation film GOX. As the gate insulation film GOX, a silicon oxide film can be used, for example. Also, other than the silicon oxide film, a high dielectric constant film that is higher in dielectric constant than the silicon oxide film may be used as the gate insulation film GOX. Further, as the gate electrode GE, a polycrystalline silicon film can be used, for example.

Source regions SR are arranged over the p-type column regions PC1 on both sides of the gate electrode GE. A channel region CH is arranged to include this source region SR therein. The channel region CH extends below the gate electrode GE via the gate insulation film GOX. A region where the gate electrode GE and the channel region CH overlap each other is an effective channel region CH (a channel forming region) of the power MOSFET. The channel region CH is formed by a semiconductor region in which a p-type impurity, such as boron (B), is introduced. The source region SR is formed by a semiconductor region in which an n-type impurity, such as phosphorus (P) or arsenic (As), is introduced. As described before, the n-type column regions NC1 and the semiconductor substrate 1S form the drain region of the power MOSFET.

When a potential is applied to the gate electrode GE of the power MOSFET, carriers (electrons) flow from the source region SR to the drain region (the n-type column region NC1 and the semiconductor substrate is (LR)) via an inversion layer formed in the channel region CH. In other words, a current flows from the drain region (the n-type column region NC1 and the semiconductor substrate 1S (LR)) to the source region SR via the inversion layer formed in the channel region CH.

The gate electrode GE extending in Y-direction, the n-type column region NC1 below the gate electrode GE, and the source regions SR on both sides of the gate electrode GE are assumed to form a unit cell. The unit cells are repeatedly arranged. A plurality of unit cells are coupled in parallel to form one power MOSFET.

In a central portion of the source region SR, a body contact region BC is formed that extends from a top surface of the epitaxial layer EPS to reach the channel region CH. This body contact region BC is a p-type semiconductor region in which a p-type impurity, such as boron (B), is introduced. The impurity concentration in the body contact region BC is higher than the impurity concentration in the channel region CH.

A top surface of the gate electrode GE and side walls on both sides thereof are covered by an interlayer insulation film IL. As the interlayer insulation film IL, a silicon oxide film can be used, for example. The interlayer insulation film IL on the body contact region BC and the source regions SR on the both sides of the body contact region BC is removed, so that a contact hole is formed. Over this contact hole and the interlayer insulation film IL, a source electrode SE is arranged. As the source electrode SE, a multilayer film including a barrier conductor film formed by a titanium tungsten film, and a main conductor film formed by an aluminum film on the barrier conductor film can be used.

Thus, the source electrode SE is electrically coupled to the source region SR, and is also electrically coupled to the channel region CH via the body contact region BC. This body contact region BC has a function of ensuring an ohmic contact with the source electrode SE. Due to the presence of this body contact region BC, a potential of the source electrode SE is applied to the source region SR and the channel region CH. The source region SR and the channel region CH are electrically coupled to each other at the same potential.

Therefore, it is possible to suppress an on operation of a parasitic npn bipolar transistor including the source region SR as an emitter region, the channel region CH as a base region, and the n-type column region NC1 as a collector region. That is, the source region SR and the channel region CH being electrically coupled at the same electric potential means that no potential difference is caused between the emitter region and the base region of the parasitic npn bipolar transistor. As a result, it is possible to suppress the on operation of the parasitic npn bipolar transistor.

A surface protective film PAS is arranged over the source electrode SE to partly cover the source electrode SE. As the surface protective film PAS, a silicon oxide film can be used, for example. A portion of the source electrode SE is exposed from the surface protective film PAS. Further, a drain electrode DE formed by a metal film is arranged on a back surface (an opposite surface to the major surface on which the epitaxial layer EPS is formed) of the semiconductor substrate 1S.

Note that the cell region CR is arranged to extend to the p-type column region PC1 located below the source region SR to which the source electrode SE is coupled.

(2) Structure of Intermediate Region TR

As shown in FIG. 2, a gate pull-up unit GPU, a gate pull-up electrode GPE, a source pull-up region SPR, and a source pull-up electrode SPE are formed in the intermediate region TR.

The gate pull-up unit GPU and the gate pull-up electrode GPE are arranged over the epitaxial layer EPS on the semiconductor substrate 1S. The source pull-up region SPR is arranged in an upper portion of the epitaxial layer EPS.

Also in this intermediate region TR, p-type column regions PC2 and n-type column regions NC2 are periodically arranged. In other words, as shown in FIG. 3, in a rectangular region in which the line-shaped p-type column regions PC2 and the line-shaped n-type column regions NC2 are alternately arranged, an outer circumferential region of the cell region CR that is a central region forms the intermediate region TR. Therefore, along a side of the intermediate region TR extending in X-direction (a side extending from side to side in FIG. 3), the line-shaped p-type column regions PC2 and the line-shaped n-type column regions NC2 are alternately arranged. Along a side of the intermediate region TR extending in Y-direction (a vertical side in FIG. 3), ends of the line-shaped p-type column regions PC2 extending from the cell region CR and ends of the line-shaped n-type column regions NC2 are alternately arranged.

As described above, the structure (the epitaxial layer EPS) in the intermediate region TR, in which the p-type column regions PC2 and the n-type column regions NC2 are periodically arranged, has the same configuration as the structure (the epitaxial layer EPS) in the cell region CR, in which the p-type column regions PC1 and the n-type column regions NC1 are periodically arranged.

The gate pull-up unit GPU is arranged over the epitaxial layer EPS via the gate insulation film GOX. Also below this gate pull-up unit GOU, the channel region CH is arranged. The interlayer insulation film IL is arranged to cover a top surface of the gate pull-up unit GPU and sidewalls on both sides thereof. In a portion of the interlayer insulation film IL, an opening is formed that exposes a portion of the top surface of the gate pull-up unit GPU. As the gate pull-up unit GPU, a polycrystalline silicon film can be used as with the gate electrode GE, for example.

Over the interlayer insulation film IL including the inside of the opening is arranged the gate pull-up electrode GPE. As the gate pull-up electrode GPE, multilayer film including a barrier conductor film formed by a titanium tungsten film and a main conductor film formed by an aluminum film on the barrier conductor film can be used, for example, as with the source electrode SE.

Herein, the gate pull-up unit GPU is electrically coupled to a plurality of gate electrodes GE. A gate voltage applied to the gate pull-up electrode GPE is applied to each of the gate electrodes GE via the gate pull-up unit GPU.

In the upper portion of the epitaxial layer EPI, there is formed the channel region CH extending from the cell region CR. The source pull-up region SPR is arranged to be included in the inside of the channel region CH. The source pull-up region SPR is a p-type semiconductor region in which a p-type impurity, such as boron (B), is introduced. Further, a plurality of n-type column regions NC2 and a plurality of p-type column regions PC2 are in contact with the channel region CH extending from the cell region CR. That is, the p-type channel region CH extending in the intermediate region TR forms a pn junction with the n-type column region NC2. The channel region CH extending from the cell region CR is coupled to the source electrode SE via the body contact region BC, and is coupled to the source pull-up electrode SPE via the p-type source pull-up region SPR. Note that the source pull-up electrode SPE is coupled to the source electrode SE. Also to the source pull-up electrode SPE, a potential equal to the potential applied to the source electrode SE is applied.

The interlayer insulation film IL is arranged over the top surface of the epitaxial layer EPI to cover the above channel region CH. In this interlayer insulation film IL, an opening is formed to expose the source pull-up region SPR.

Over the interlayer insulation film IL including the inside of the opening is arranged the source pull-up electrode SPE. As the source pull-up electrode SPE, multilayer film including a barrier conductor film formed by a titanium tungsten film and a main conductor film formed by an aluminum film on the barrier conductor film can be used, for example, as with the source electrode SE.

Also in the intermediate region TR, the surface protective film PAS formed by a silicon oxide film is arranged to partly cover the gate pull-up electrode GPE and the source pull-up electrode SPE. A portion of the gate pull-up electrode GPE and a portion of the source pull-up electrode SPE are exposed from the surface protective film PAS.

(3) Structure of Peripheral Region PER

As shown in FIG. 2, a field plate electrode (also called an electrode or a dummy electrode) FFP is formed in the peripheral region PER.

The field plate electrode FFP is arranged over the epitaxial layer EPS on the semiconductor layer 1S.

Also in this peripheral region PER, p-type column regions PC3 and n-type column regions NC3 are periodically arranged. As shown in FIG. 3, an outer circumferential region of the rectangular region where the line-shaped p-type column regions PC1 and the line-shaped n-type column regions NC1 are alternately arranged (the cell region CR and the intermediate region TR) forms the peripheral region PER. Along a side of the peripheral region PER extending in X-direction (a side extending from side to side in FIG. 3), the line-shaped p-type column regions PC3 and the line-shaped n-type column regions NC3 both extending in X-direction are alternately arranged. Along a side of the peripheral region PER extending in Y-direction vertical side in FIG. 3), the line-shaped p-type column regions PC3 and the line-shaped n-type column regions NC3 both extending in Y-direction are alternately arranged.

Further, the p-type column regions PC3 and the n-type column regions NC3 (the epitaxial layer EPS) in this peripheral region PER are designed to have the same widths as the p-type column regions PC1 and PC2 and the n-type column regions NC1 and NC2 in the cell region CR and the intermediate region TR.

The field plate electrode FFP is formed over the p-type column region PC3 and the n-type column region NC3 (the epitaxial layer EPS) in this peripheral region PER (see FIG. 2). As the field plate electrode FFP, a polycrystalline silicon film can be used, for example, as with the gate electrode GE. The field plate electrode FFP is covered by the interlayer insulation film IL. Over the interlayer insulation film IL, the surface protective film PAS formed by a silicon oxide film is arranged. By providing the field plate electrode FFP in this manner, it is possible to relax electric-field concentration on the surface of the epitaxial layer EPS and improve a breakdown voltage.

The field plate electrode FFP is arranged above a boundary between the p-type column region PC3 and the n-type column region NC3, for example, and is arranged in form of a line as with the p-type column region PC3 and the n-type column region NC3.

The power MOSFET is arranged on the major surface of the above-described structure (the superjunction structure) in which the p-type column regions (PC1) and the n-type column regions (NC1) are periodically arranged. This enables a high breakdown voltage to be ensured and can also reduce an on-state resistance.

In a case where the power MOSFET is arranged on the major surface of the structure (the superjunction structure) in which the p-type column regions (PC1) and the n-type column regions (NC1) are periodically arranged, a depletion layer extends laterally from a boundary region between the p-type column region (PC1) and the n-type column region (NC1), i.e., the pn junction extending in a vertical direction (Z-direction). Therefore, in the power MOSFET having the superjunction structure, the breakdown voltage can be ensured because of the depletion layer spreading laterally from the pn junction extending vertically (in Z-direction), even when the impurity concentration in the n-type column region NC1 that serves as current paths is increased in order to reduce the on-state resistance.

As described above, it is possible to reduce the on-state resistance while ensuring the high breakdown voltage, by employing the structure in which the p-type column regions (PC1) and the n-type column regions (NC1) are periodically arranged.

In addition, the p-type column regions (PC2 and PC3) and the n-type column regions (NC2 and NC3) are periodically arranged also in the intermediate region TR and the peripheral region PER, not in the cell region CR only. Due to this configuration, the depletion layer spreads to surround the cell region CR and therefore the breakdown voltage can be further improved.

(4) Defect Region DF

As shown in FIG. 4, a defect region DF is selectively formed in the n-type column region NC1 of the cell region CR by ion radiation. That is, the defect region DF corresponds to an ion radiation region. The defect region DF is not formed in the p-type column region PC1 of the cell region CR. Also, in the intermediate region TR and the peripheral region PER, neither the p-type column region (PC2, PC3) nor the n-type column region (NC2, NC3) has the defect region DF. However, the defect region DF is formed in the n-type column region NC2 adjacent to the p-type column region PC1 located at an end of the cell region CR in some cases. In those cases, it is important that no defect region DF is formed in the n-type column regions NC2 located on the peripheral region PER side of the n-type column region NC2 having the defect region DF in the intermediate region TR. In other words, there are a plurality of n-type column regions NC2 having no defect region DF on the peripheral region PER side of the n-type column region NC2 having the defect region DF.

Line X1-X1 in FIG. 4 represents central portions of the p-type column region PC1 and the n-type column region NC1 in Z-direction. Line X2-X2 represents upper portions of the p-type column region PC1 and the n-type column region NC1 in Z-direction, which are located at a deeper level than the channel region CH. That is, no defect region DH is formed at the pn junction between the channel region CH and the n-type column region NC1.

As shown in FIG. 5A, the ion radiation amount is high in the n-type column region NC1 and is lower than in the p-type column region PC1 and the n-type column region NC2 than in the n-type column region NC1 in the present embodiment, the ion radiation amount is zero in the p-type column region PC1 and the n-type column region NC2. Further, in the n-type column region NC1, the ion radiation amount in a portion close to the p-type column region PC1 is lower than that in a central portion (in X-direction) of the n-type column region NC1. Note that the ion radiation amount means a concentration of ions remaining in the n-type column region NC1.

The ion radiation amount corresponds to a defect density. Therefore, as shown in FIG. 5B, the resistivity of the n-type column region NC1 is higher than those of the p-type column region PC1 and the n-type column region NC2. As shown in FIG. 5C, a hole lifetime in the n-type column region NC1 is lower than those in the p-type column region PC1 and the n-type column region NC2. Further, in the interface between the n-type column region NC1 and the p-type column region PC1, the ion radiation amount is low, the defect density is low, the resistivity is low, and the hole lifetime is high.

In sections of the p-type column region PC1 and the n-type column region NC1, taken along the line X2-X2, the ion radiation amount is zero as shown in FIG. 6A, and the resistivities of the n-type column region NC1, the p-type column region PC1, and the n-type column region NC1 are equal as shown in FIG. 6B. Further, the hole lifetimes in the n-type column region NC1, the p-type column region PC1, and the n-type column region NC2 are equal, as shown in FIG. 6C.

As shown in FIG. 7A, the ion radiation amount in a depth direction is high in the central portion of the n-type column region NC1 and is low (zero) on the channel region CH side and the n-type semiconductor region LR side. That is, ion radiation has not been performed for the interface between the n-type column region NC1 and the channel region CH and the interface between the n-type column region NC1 and the n-type semiconductor region LR. That is, the defect region DF is formed in the n-type column region NC1 but is not formed in the interface between the n-type column region NC1 and the channel region CH and the interface between the n-type column region NC1 and the n-type semiconductor region LR.

As shown in FIG. 7B, the resistivity is high in the n-type column region NC1, and is lower in the interface between the n-type column region NC1 and the channel region CH and the interface between the n-type column region NC1 and the n-type semiconductor region LR than in the n-type column region NC1. Also, as shown in FIG. 7C, the hole lifetime is low in the n-type column region NC1, and is higher in the interface between the n-type column region NC1 and the channel region CH and the interface between the n-type column region NC1 and the n-type semiconductor region LR than in the n-type column region NC1.

As shown in FIG. 8A, the ion radiation amount in the n-type column region NC2 is zero. The resistivities of the n-type column region NC2, the channel region CH, and the n-type semiconductor region LR are equal, as shown in FIG. 8B. Further, the hole lifetimes in the n-type column region NC2, the channel region CH, and the n-type semiconductor region LR are equal, as shown in FIG. 8C.

According to the present embodiment, the following features can be obtained.

Due to the defect region DF formed in the n-type column region NC1, a recovery time of a built-in diode can be reduced. The built-in diode is the pn junction formed between the p-type channel region CH or the p-type column region PC1 and the n-type column region NC1, for example. Because the defect region DF is provided in the n-type column region NC1, it is possible to quickly eliminate holes injected from the p-type channel region CH or the p-type column region PC1 to the n-type column region NC1 when the built-in diode transitions from the on state to the off state. This results in improvement of recovery characteristics of the built-in diode and improvement of switching characteristics of the vertical power MOSFET.

The defect region DF is formed on the internal side of the n-type column region NC1 but is not formed in the interface between the n-type column region NC1 and the p-type column region PC1. Therefore, a leak current between a source and a drain of the vertical power MOSFET can be reduced. In addition, the defect region DF is formed at a deeper level than the channel region CH in the n-type column region NC1, but is not formed in the interface between the n-type column region PC1 and the channel region CH. Therefore, the leak current between the source and drain of the vertical power MOSFET can be reduced.

The defect regions DF are formed in all the n-type column regions NC1 of the cell region CR, whereas no defect region is formed in the n-type column regions NC2 and NC2 and the p-type column regions PC2 and PC3 in the intermediate region TR and the peripheral region PER. Therefore, it is possible to improve the breakdown voltage of the vertical power MOSFET while improving the recovery characteristics of the built-in diode. Further, because of reduction of the leak current in the built-in diode (the pn junction) formed in the intermediate region TR, low power consumption can be achieved. That is, the defect density (i.e., the ion radiation amount) in the n-type column region NC1 of the cell region CR is higher than the defect density (i.e., the ion radiation amount) in the n-type column region NC2 of the intermediate region TR or the n-type column region NC3 of the peripheral region PER.

In addition, also in a case where the defect region DF is formed in the intermediate region TR, the n-type column region NC2 and the p-type column region PC2 having no defect region DF are provided on the peripheral region PER side in the intermediate region TR. Therefore, it is possible to improve the breakdown voltage of the vertical power MOSFET.

The defect region DF is formed selectively at a deep level in the n-type column region NC1, but is not formed in a surface portion. Therefore, an unnecessary level is not generated directly below the gate insulation film GOX or the gate electrode GE, so that the leak current can be reduced.

[Description of Manufacturing Method]

Next, a manufacturing method of the semiconductor device according to the present embodiment is described, referring to FIGS. 9 to 26. Also, the configuration of the semiconductor device according to the present embodiment is more clarified. FIGS. 9 to 26 are cross-sectional views or plan views showing manufacturing steps of the semiconductor device according to the present embodiment. The semiconductor device according to the present embodiment is manufactured by a so-called "trench fill method".

Figure 9:
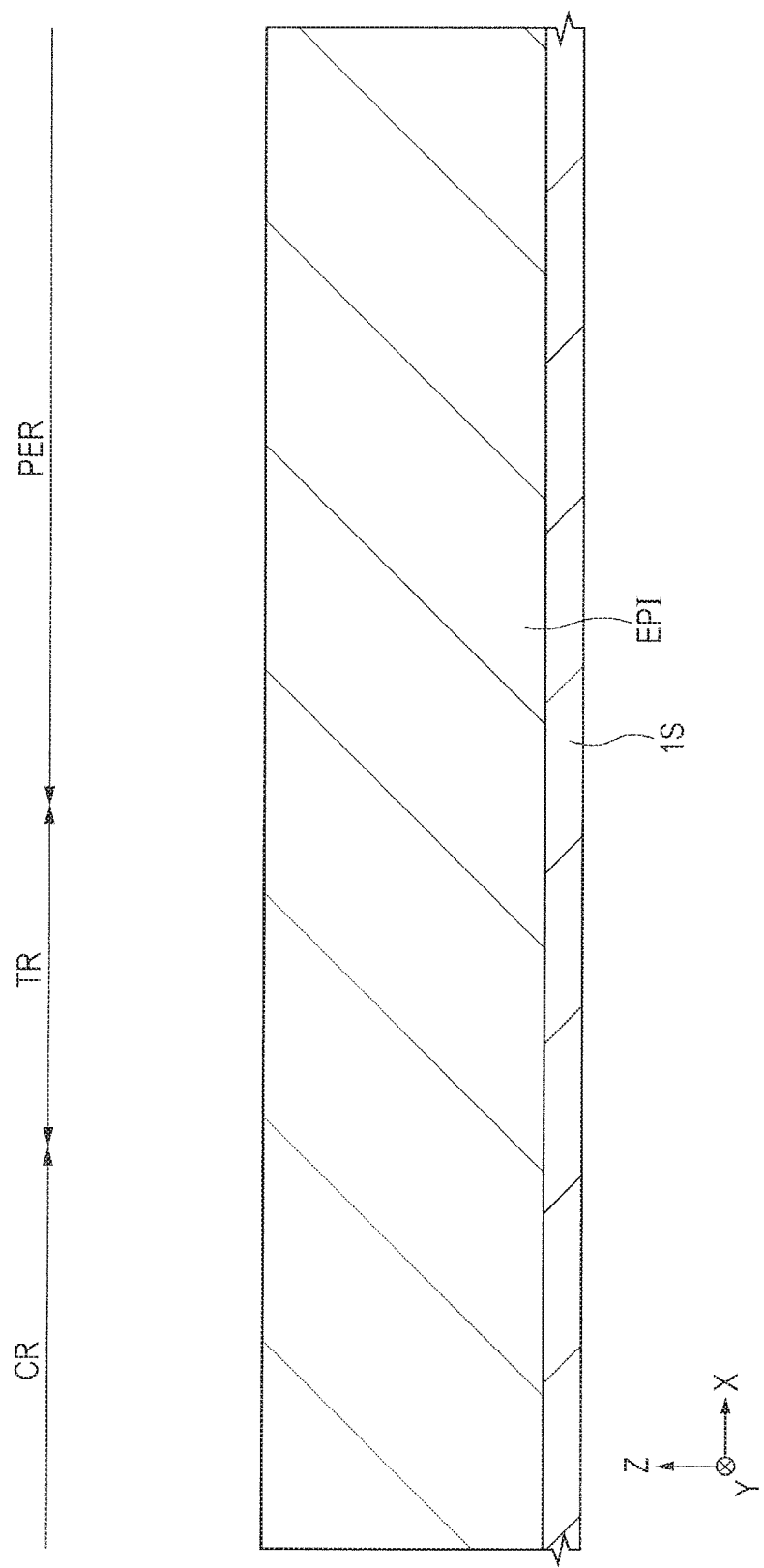
FIG. 9 is a cross-sectional view showing a manufacturing step of the semiconductor device according to the first embodiment.

First, as shown in FIG. 9, the semiconductor substrate 1S is prepared, which has the epitaxial layer EPI formed by an n-type semiconductor layer on the major surface (a surface or a top surface). For example, the semiconductor substrate 1S is formed by introducing an n-type impurity, such as phosphorus (P) or arsenic (As), into single crystal silicon. The n-type impurity concentration in the epitaxial layer EPI is about $3.4 \times 10^{15}/cm^3$, for example. The thickness of the epitaxial layer EPS is about 40 to 60 μm, for example.

Figure 10:
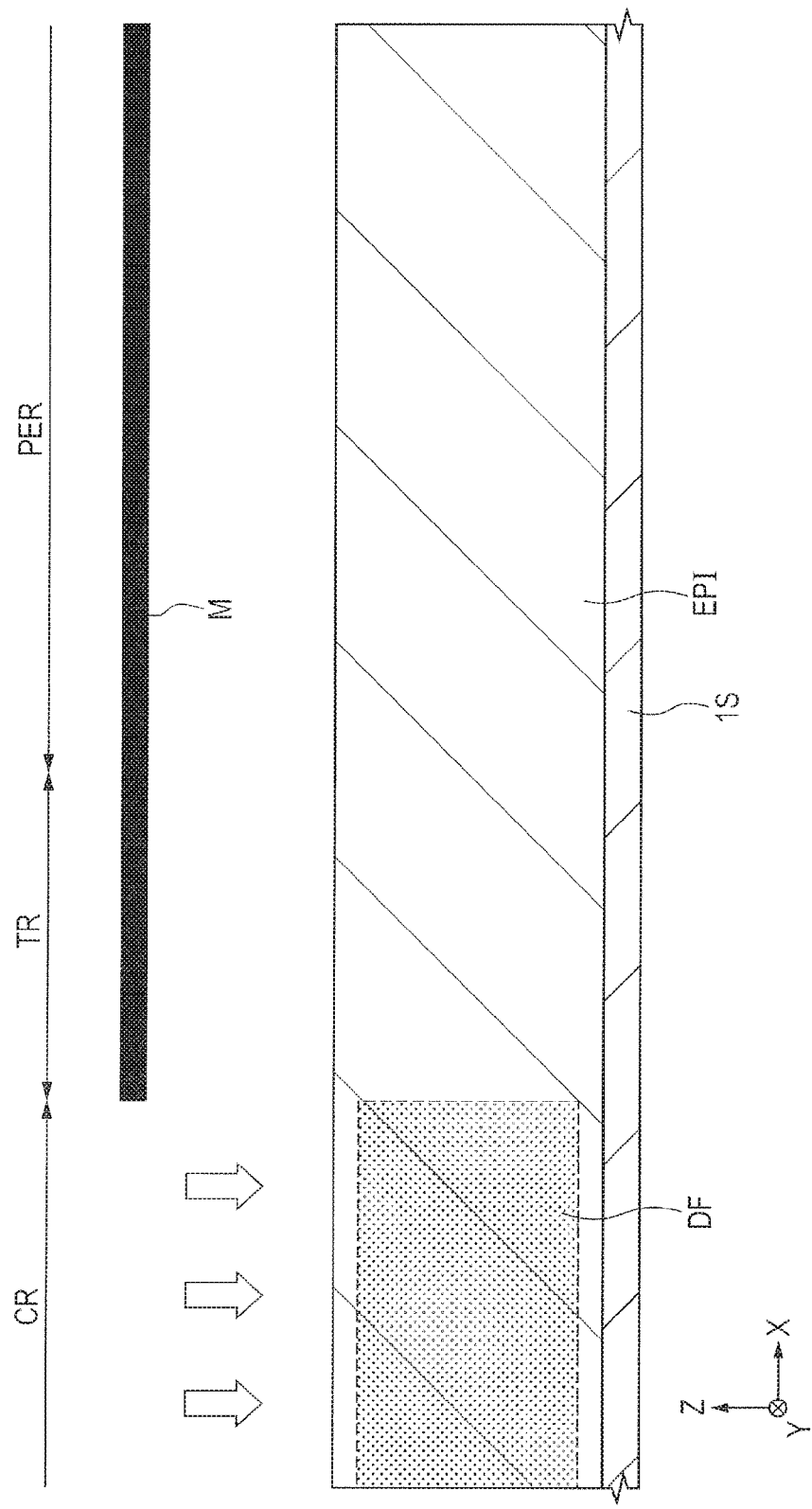
FIG. 10 is a cross-sectional view showing a manufacturing step of the semiconductor device according to the first embodiment, following FIG. 9.

Subsequently, an ion radiation step is performed, as shown in FIG. 10. First, ion radiation is performed selectively for the cell region CR by using a shielding mask M that covers the intermediate region TR and the peripheral region PER but is opened in the cell region CR. In this manner, the defect region DF is formed in the epitaxial layer EPI. Proton ($^1H^+$) or helium ($^3He^{2+}$, $^4He^{2+}$) as an ion type is implanted at an implantation energy of 10 MeV. The radiation amount is set to $10^{17}$ to $10^{18} cm^{-2}$. Thereafter, annealing for recovering amorphousness is performed at 350° C. to 400° C. In the present embodiment, the radiation amount can be increased, because an epitaxial growth step for forming the p-type column regions PC1, PC2, and PC3 and a step of forming the gate insulation film GOX, that will be described later, are performed after the ion radiation step. That is, it is possible to increase the number of defects, and improve the recovery characteristics of the built-in diode.

As the shielding mask M, an aluminum foil having a thickness of several hundreds of microns is used. Assuming that a processing accuracy and a positioning accuracy of the shielding mask M are about 10 μm, for example, the shielding mask M may expose a portion of the intermediate region TR, which is located on the cell region CR side, in order to form the defect region DF over the entire region of the cell region CR. In that case, it is important to cover the most of the intermediate region TR, which is located on the peripheral region PER side, by the shielding mask M, so that no defect region DF is formed.

Figure 11:
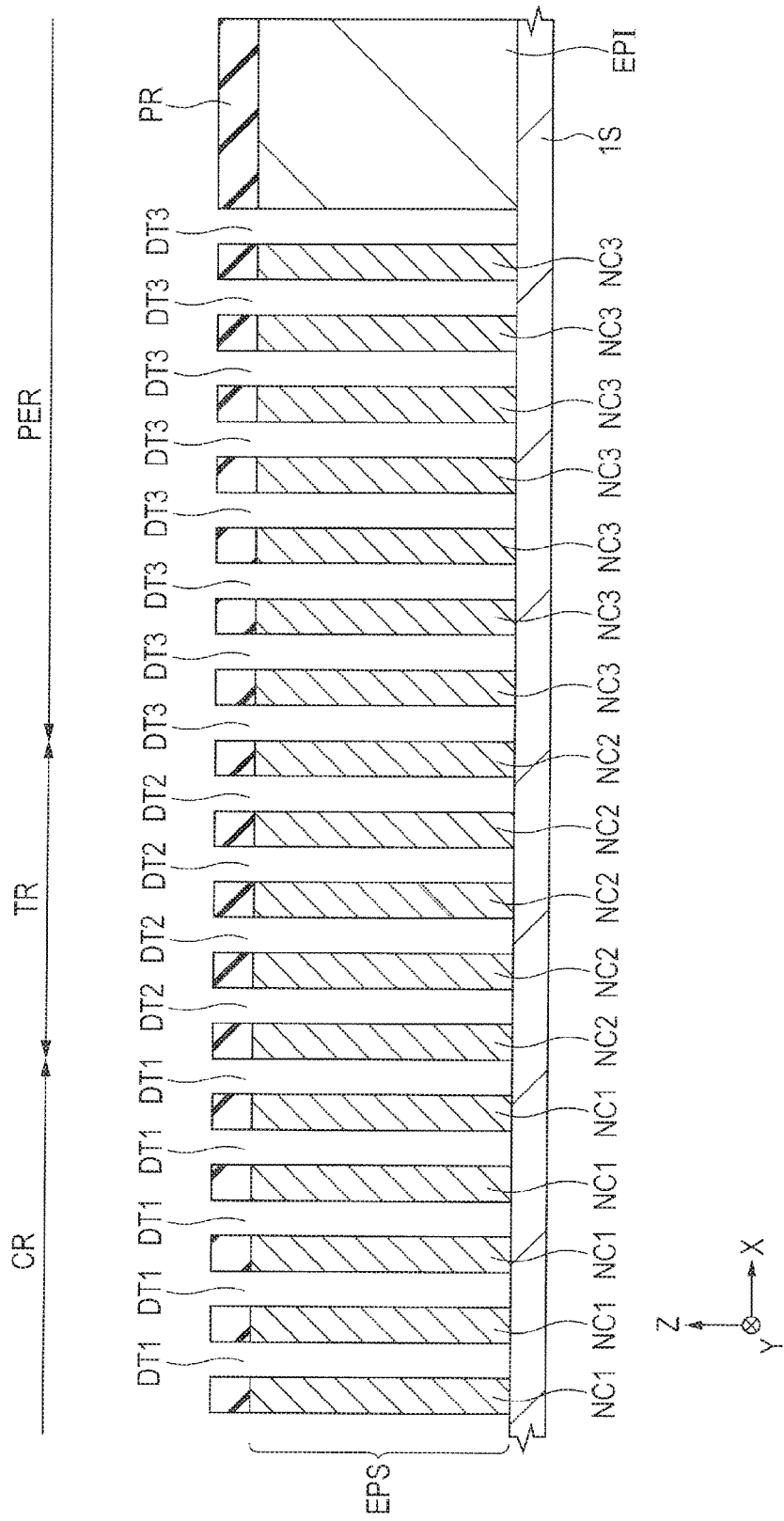
FIG. 11 is a cross-sectional view showing a manufacturing step of the semiconductor device according to the first embodiment, following FIG. 10.

Then, as shown in FIG. 11, a photoresist film PR is formed on the epitaxial layer EPI, and is patterned and developed. The photoresist film PR has a pattern that covers a region where the n-type column regions (NC1, NC2, and NC3) are formed and exposes a region where the p-type column regions (PC1, PC2, and PC3) are formed. Although light exposure (transfer of a reticle) for the cell region CR (including the intermediate region TR) and the peripheral region PER may be performed at once, it may be performed individually for each region.

Figure 12:
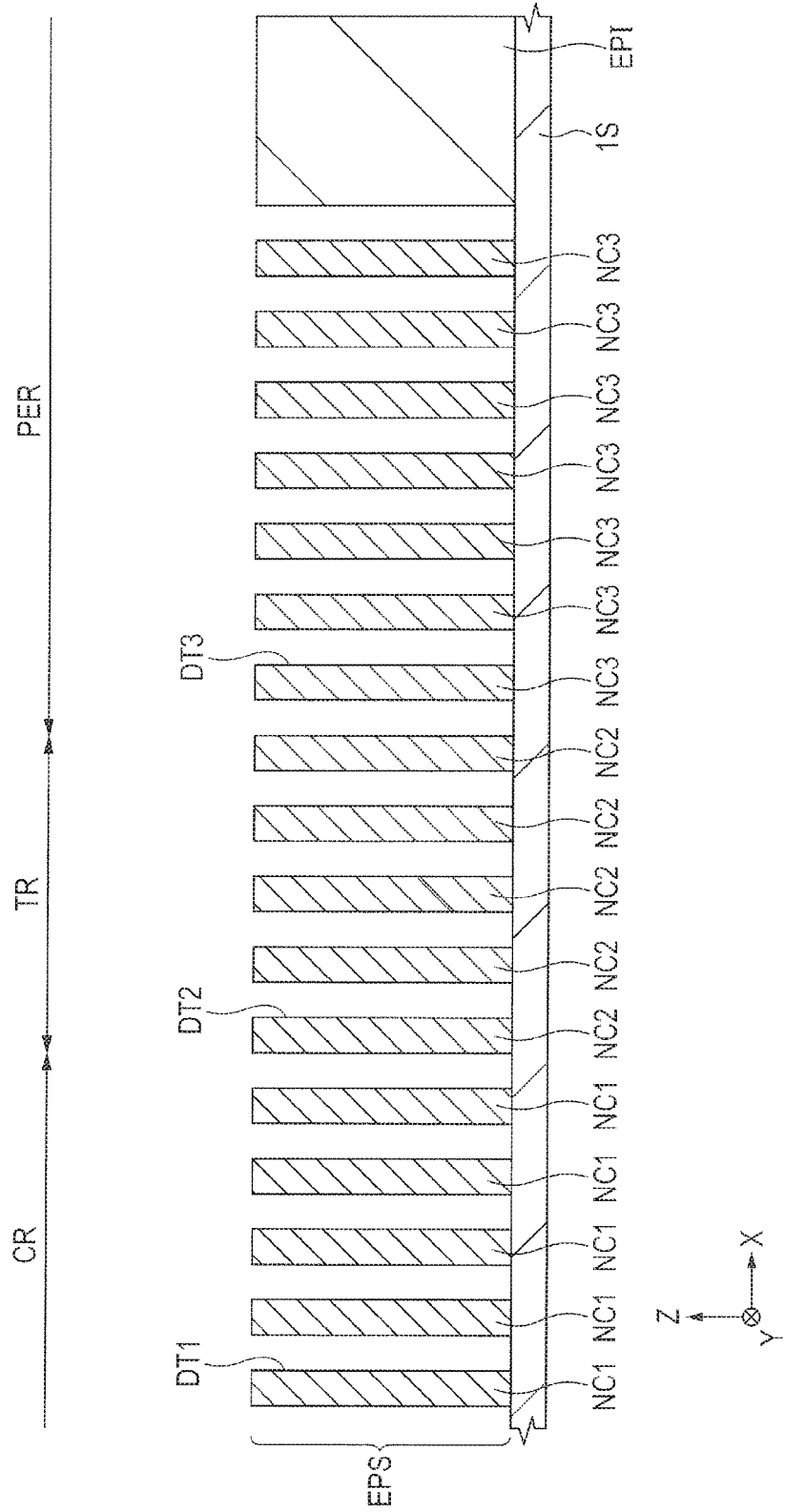
FIG. 12 is a cross-sectional view showing a manufacturing step of the semiconductor device according to the first embodiment, following FIG. 11.

The epitaxial layer EPI is then etched with the photoresist film PR used as mask. This etching removes the epitaxial layer EPI in the region where the p-type column regions (PC1, PC2, and PC3) are formed, and forms grooves (also called trenches, DT1, DT2, and DT3). Etching of the epitaxial layer EPI may be performed using a hard mask (e.g., a silicon oxide film or a silicon nitride film) as the etching mask, after the pattern of the photoresist film PR is transferred to the hard mask arranged between the epitaxial layer EPI and the photoresist film PR. Then, as shown in FIG. 12, the photoresist film PR is removed by ashing, for example. To process an underlying film to have a desired shape by performing etching that uses the photoresist film processed in the desired shape by light exposure and development or the hard mask film as the mask, is called patterning.

Figure 13:
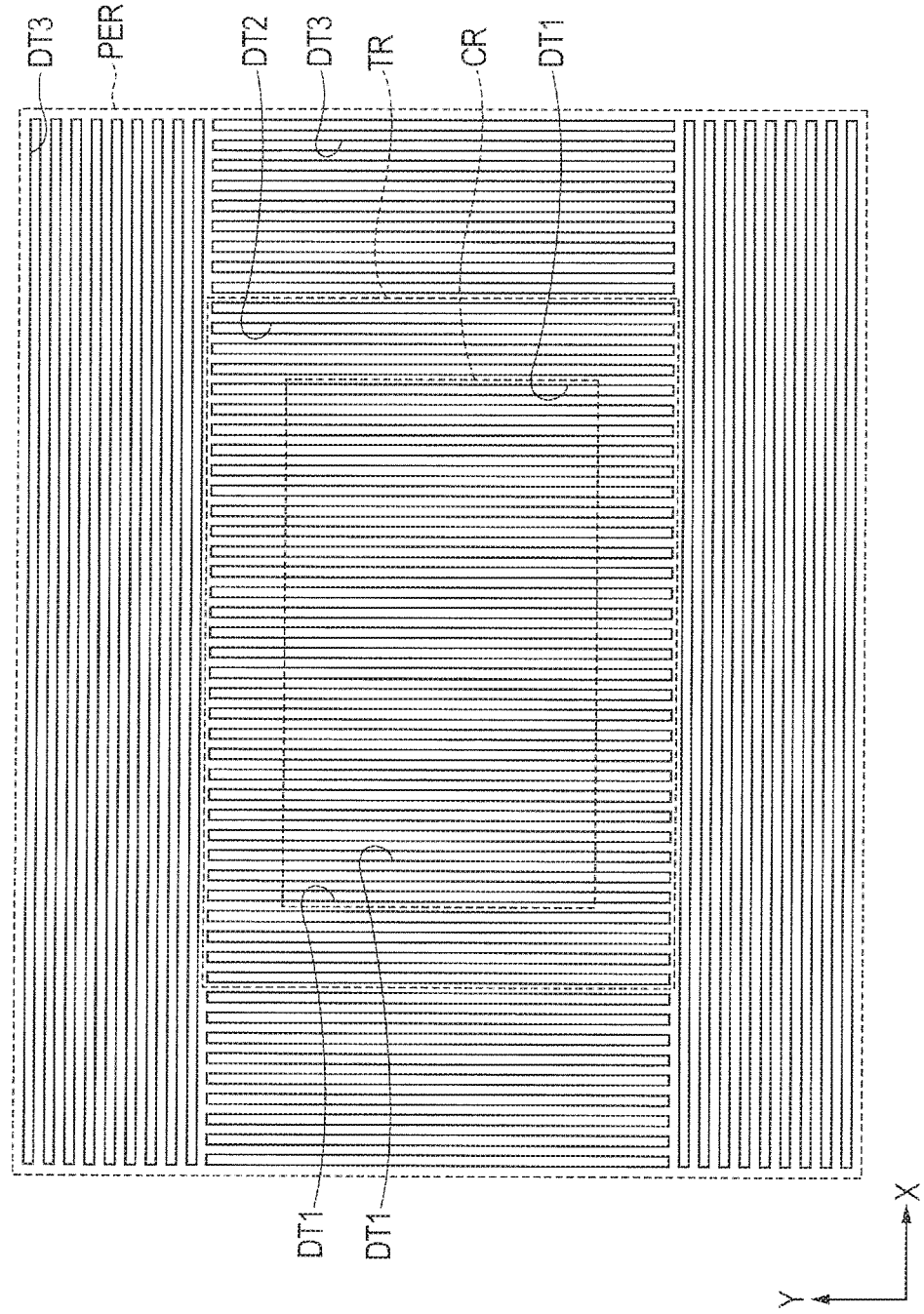
FIG. 13 is a plan view showing a manufacturing step of the semiconductor device according to the first embodiment.

Herein, as shown in FIGS. 12 and 13, it is assumed that DT1, DT2, and DT3 respectively denote the groove formed in the epitaxial layer EPI of the cell region CR, the groove formed in the epitaxial layer EPI of the intermediate region TR, and the groove formed in the epitaxial layer EPI of the peripheral region PER. The grooves DT1 and DT2 have a line shape extending in Y-direction, while the grooves DT3 have a line shape extending in Y- or X-direction (FIG. 13).

For example, the widths (the dimensions in X- or Y-direction) and the depths (the dimensions in Z-direction) of the grooves DT1, DT2, and DT3 are about 2 to 5 µm and about 40 to 60 µm, respectively. The epitaxial layers EPI left between these grooves DT1, DT2, and DT3 form the line-shaped n-type column regions NC1, NC2, and NC3. For example, the widths (the dimensions in X-direction) of the n-type column regions (NC1, NC2, and NC3) are about 2 to 5 µm. Also, the depths (the dimensions in Z-direction) of the n-type column regions (NC1, NC2, and NC3) are about 40 to 60 µm, for example.

Figure 14:
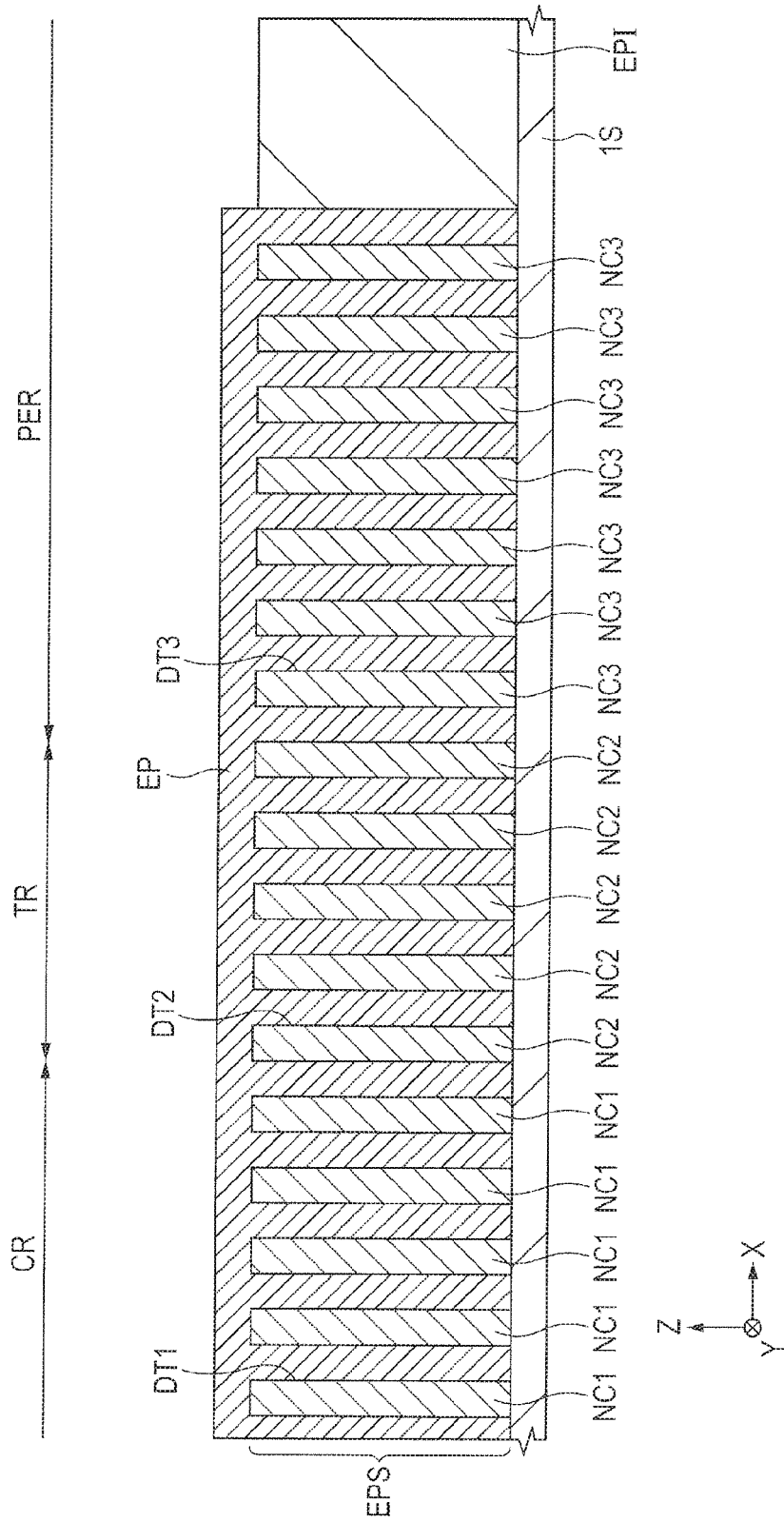
FIG. 14 is a cross-sectional view showing a manufacturing step of the semiconductor device according to the first embodiment, following FIG. 12.

Then, as shown in FIG. 14, a p-type epitaxial layer EP is formed inside the grooves DT1, DT2, and DT3, and on the epitaxial layer EPI by embedded epitaxial growth. That is, the epitaxial layer is formed under a condition of 1000° C. and about 30 minutes while a p-type impurity is introduced. In the epitaxial growth, it is suitable to use trichlorosilane based gas, because the use of that gas hardly eliminates defects formed by ion radiation. At this step, the epitaxial layer EP grows from bottom surfaces and side walls (side surfaces) of the grooves DT1, DT2, and DT3, thus the inside of the grooves DT1, DT2, and DT3 are embedded. The epitaxial layer EP also grows on the epitaxial layer EPI located between the grooves and over the embedded grooves DT1, DT2, and DT3. The p-type impurity concentration in the p-type epitaxial layer EP is about $3.0 \times 10^{15}/cm^3$, for example.

Note that it is important to perform hydrogen baking, for example, for the side walls of the grooves DT1, DT2, and DT3 prior to the embedded epitaxial growth, thereby reducing the defect density in surfaces of the side walls of the grooves DT1, DT2, and DT3. Hydrogen baking is performed under a condition of a hydrogen flow rate of 5 l/min, 1000° C., and 10 minutes, for example.

Figure 15:
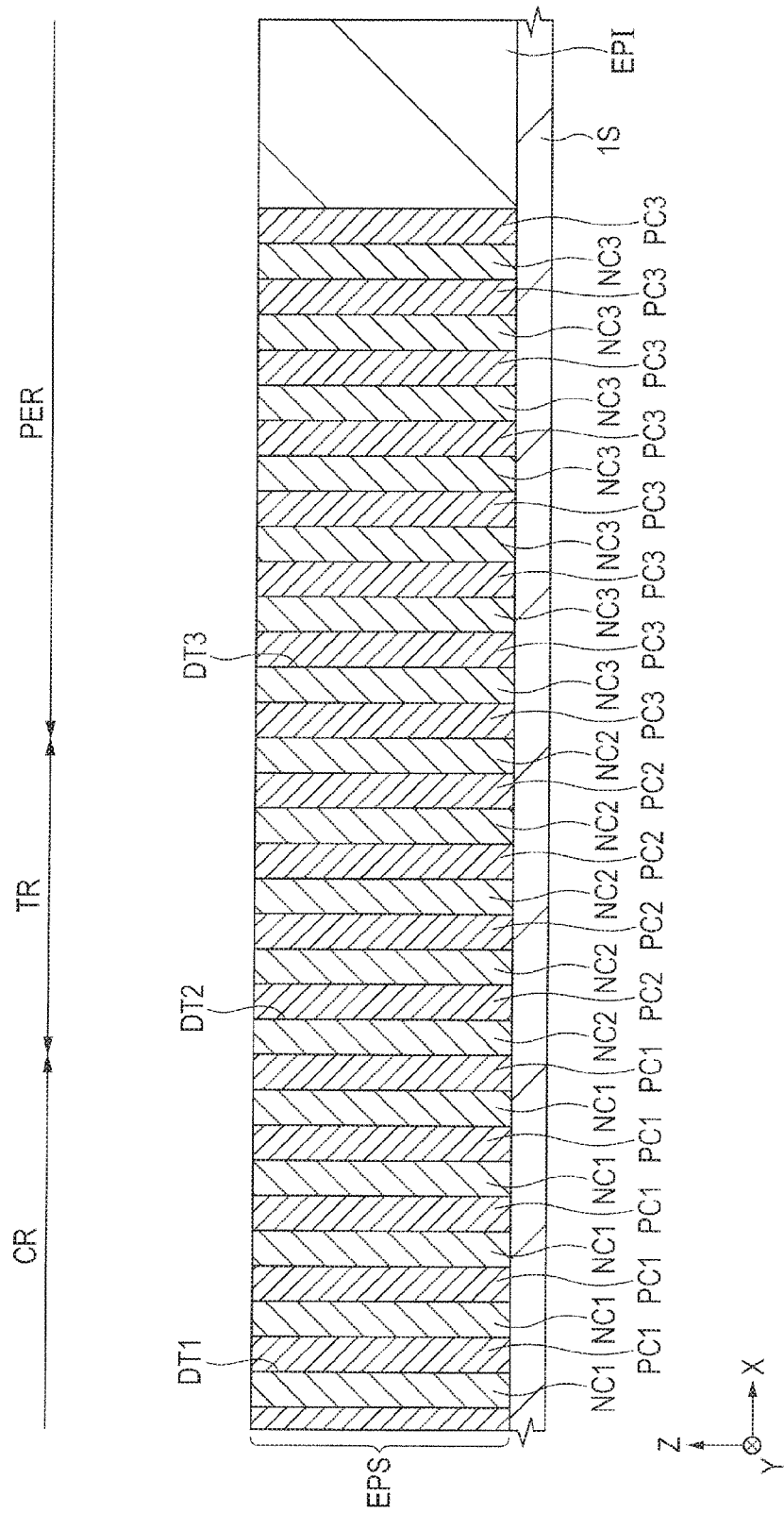
FIG. 15 is a cross-sectional view showing a manufacturing step of the semiconductor device according to the first embodiment, following FIG. 14.

Then, as shown in FIG. 15, the epitaxial layer EP above the grooves DT1, DT2, and DT3 is removed by CMP (Chemical Mechanical Polishing), for example. In this manner, the epitaxial layer EP is embedded to the inside of the grooves DT1, DT2, and DT3. Thus, the line-shaped p-type column regions PC1, PC2, and PC3 are formed. In other words, an epitaxial layer EPS including a plurality of p-type column regions PC1, PC2, and PC3 and a plurality of n-type column regions NC1, NC2, and NC3 is formed. By performing the step of removing the defect density in the surfaces of the side walls of the grooves DT1, DT2, and DT3 prior to the epitaxial growth as described above, it is possible to reduce the defect density in the interfaces between the p-type column regions PC1, PC2, and PC3 and the n-type column regions NC1, NC2, and NC3 and reduce a leak current in the interfaces.

Figure 16:
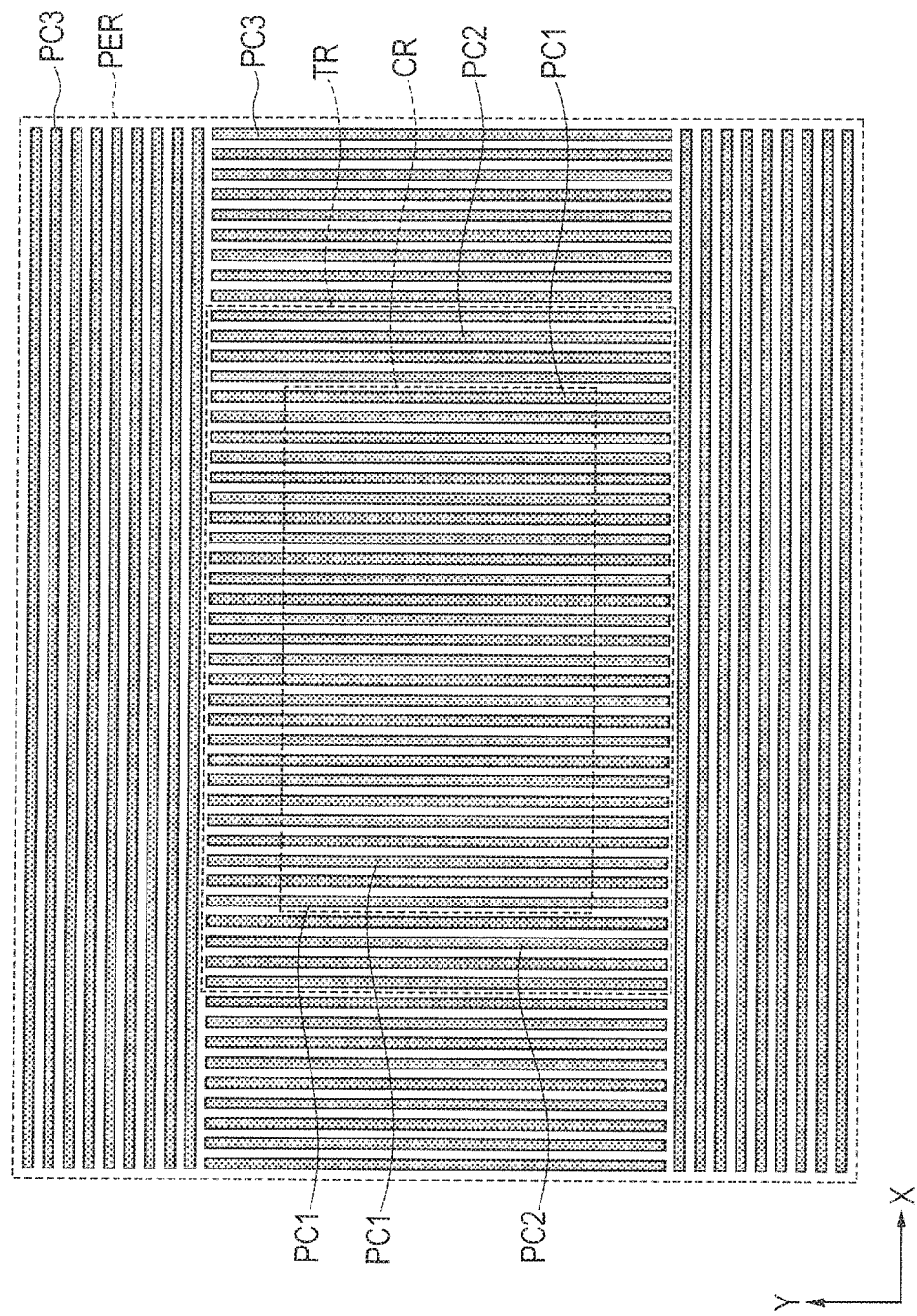
FIG. 16 is a plan view showing a manufacturing step of the semiconductor device according to the first embodiment.

By the above steps, the structure in which the line-shaped p-type column regions PC1 extending in Y-direction and the line-shaped n-type column regions NC1 extending in Y-direction are alternately arranged in X-direction periodically is formed in the cell region CR and the intermediate region TR. Also, in the peripheral region PER, the structure is formed in which the line-shaped p-type column regions PC3 extending in Y-direction and the line-shaped n-type column regions NC3 extending in Y-direction are alternately arranged in X-direction periodically, and the structure is formed in which the line-shaped p-type column regions PC3 extending in X-direction and the line-shaped n-type column regions NC3 extending in X-direction are alternately arranged in Y-direction periodically (FIG. 16).

Subsequently, the power MOSFET, the gate pull-up unit GPU, the gate pull-up electrode GPE, the source pull-up region SPR, the source pull-up electrode SPE, and the field plate electrode FFP, for example, are formed over the major surface of the epitaxial layer EPS.

Figure 17:
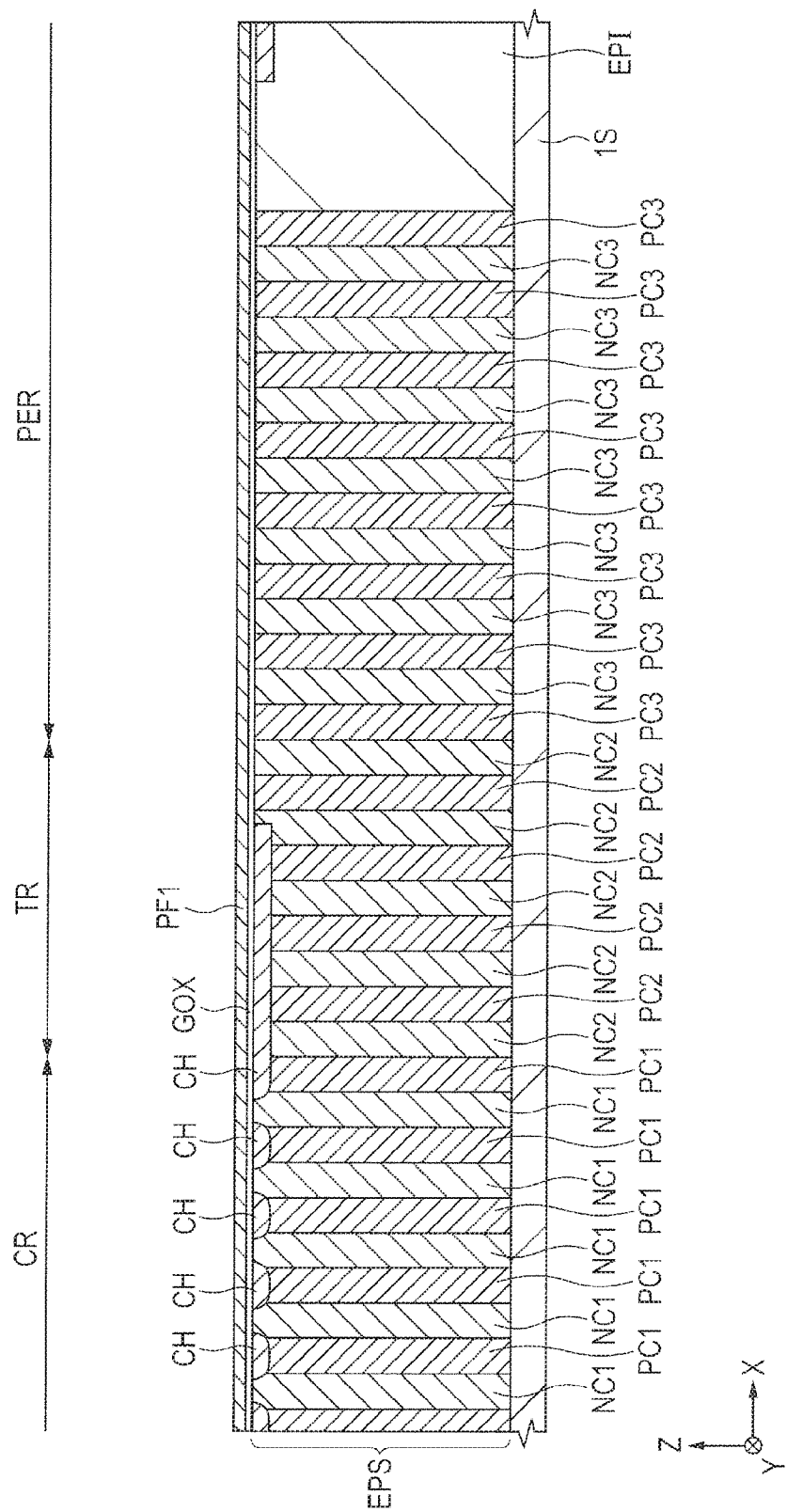
FIG. 17 is a cross-sectional view showing a manufacturing step of the semiconductor device according to the first embodiment, following FIG. 15.

For example, the channel region CH is formed, as shown in FIG. 17. For example, a mask film having an opening in a region where the channel region CH is to be formed is formed by using a photolithography technique and an etching technique. Then, impurity ions are implanted with this mask film used as mask, to form the channel region CH. For example, p-type impurity ions, such as boron (B), are implanted as the impurity ions. In this manner, a p-type semiconductor region that serves as the channel region CH can be formed.

Then, the mask film is removed, the gate insulation film GOX is formed on the epitaxial layer EPS, and a conductor film PF1 is formed on the gate insulation film GOX. For example, a silicon oxide film is formed as the gate insulation film GOX by thermal oxidation of the surface of the epitaxial layer EPS. Then, a polycrystalline silicon film is deposited on the silicon oxide film by a CVD method, for example. As the gate insulation film GOX, a high dielectric constant film that is higher in dielectric constant than the silicon oxide film, e.g., a hafnium oxide film, may be used in place of the silicon oxide film. In addition, the gate insulation film GOX may be formed by a CVD method or the like.

Figure 18:
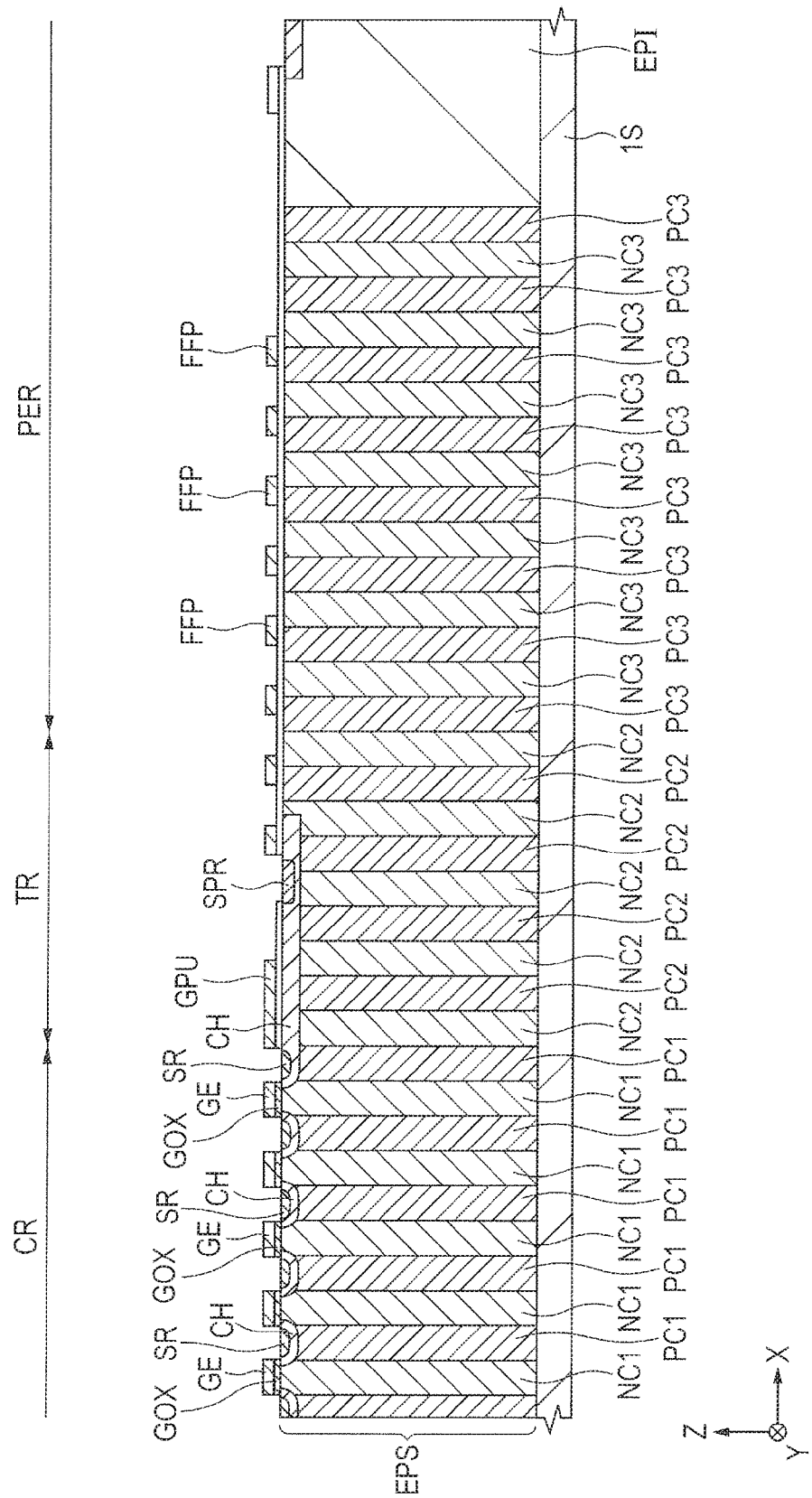
FIG. 18 is a cross-sectional view showing a manufacturing step of the semiconductor device according to the first embodiment, following FIG. 17.
Figure 19:
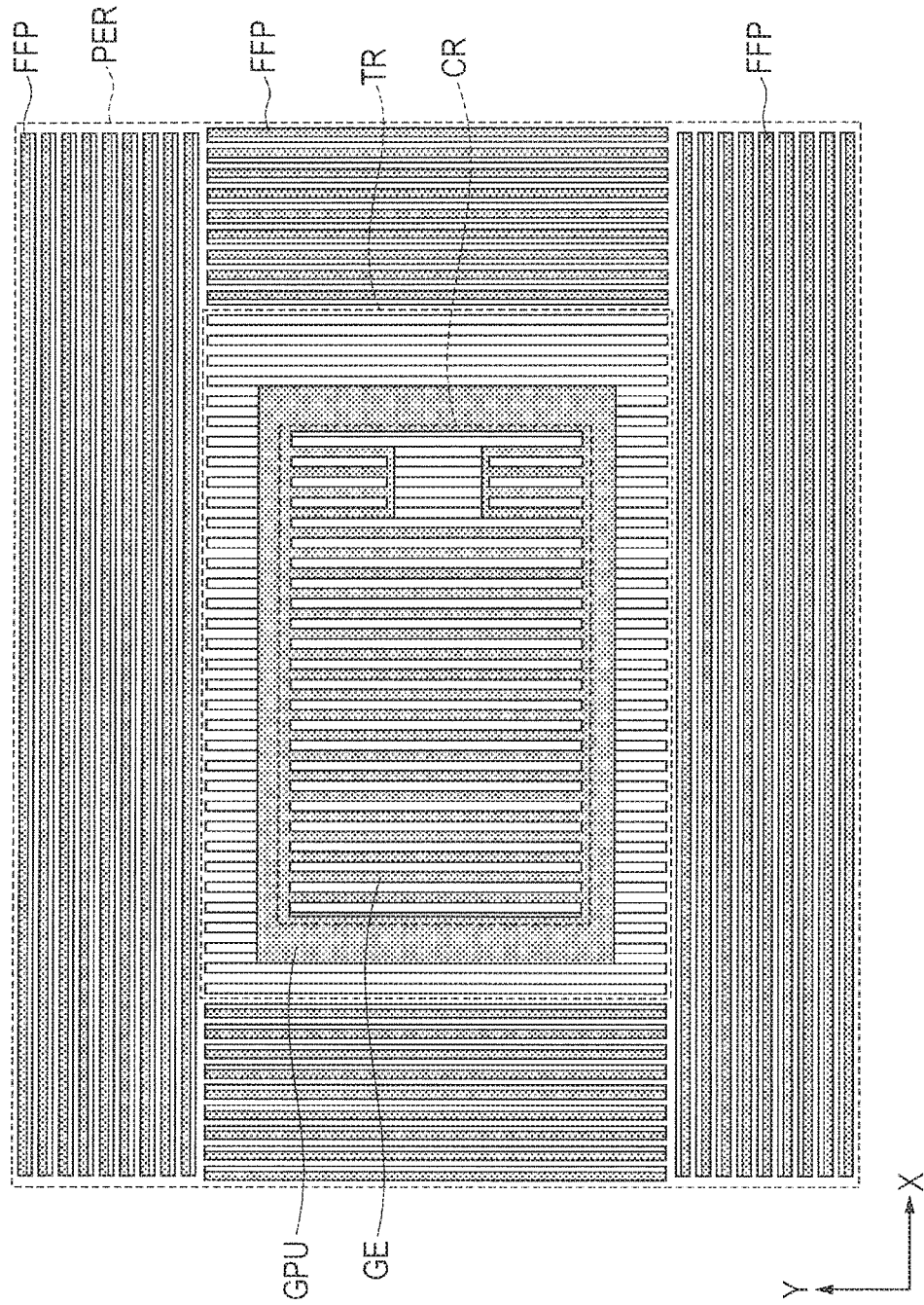
FIG. 19 is a plan view showing a manufacturing step of the semiconductor device according to the first embodiment.

Then, as shown in FIG. 18, the gate electrode GE is formed over the n-type column region NC1. Also, the gate pull-up unit GPU is formed in the intermediate region TR. Further, the field plate electrode FFP is formed over the pn junction between the p-type column region PC3 and the n-type column region NC3. For example, a photoresist film is formed on the conductor film PF1 to cover a region where the gate electrode GE is to be formed, a region where the gate pull-out unit GPU is to be formed, and a region where the field plate electrode FFP is to be formed. The conductor film PF1 is then etched by using this photoresist film as mask. In this manner, the gate electrode GE and the field plate electrode FFP are formed. For example, as shown in FIG. 19, the gate electrode GE is formed to have a line shape as with the p-type column region PC1. The gate pull-out unit GPU is frame-shaped (ring-shaped) and couples both ends of the gate electrodes GE extending in Y-direction. That is, the gate pull-out unit GPU is electrically coupled to the gate electrodes GE. The field plate electrode FFP is formed to have a line shape as with the p-type column region PC3.

Figure 20:
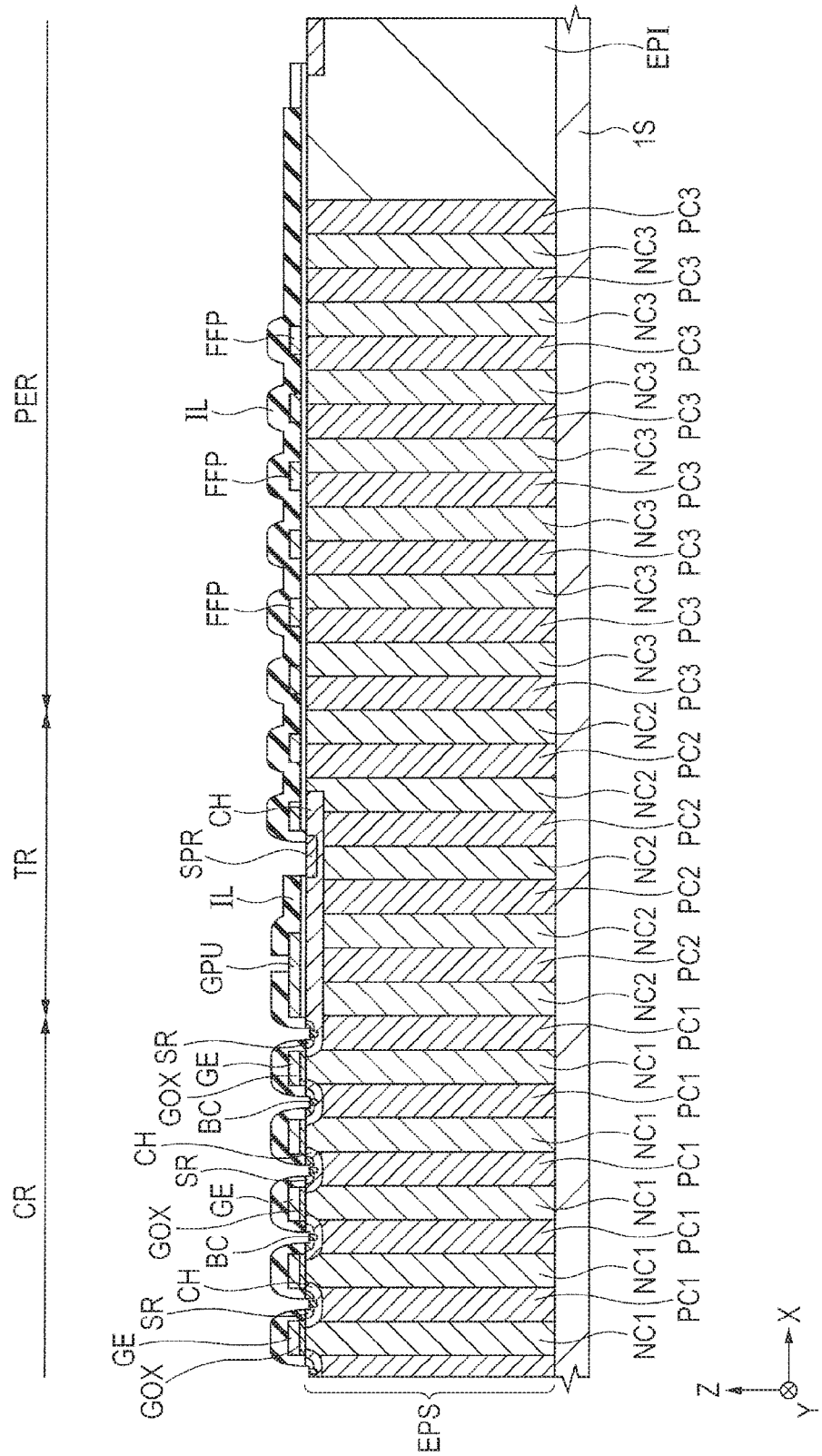
FIG. 20 is a cross-sectional view showing a manufacturing step of the semiconductor device according to the first embodiment, following FIG. 18.

Subsequently, as shown in FIG. 20, the source region SR, and the source pull-out region SPR are formed. For example, the peripheral region PER and a region of the intermediate region TR, other than a region where the source pull-out region SPR is to be formed, is covered by a photoresist film (not shown). Then, n-type impurity ions are implanted with this photoresist film and the gate electrode GE in the cell region CR used as mask. For example, the n-type impurity ions, such as phosphorous (P) or arsenic (As), are implanted as the impurity ions. Thus, an n-type semiconductor region as the source region SR can be formed between the gate electrodes GE in the cell region CR. The source region SR is formed in the major surface of the epitaxial layer EPS between the adjacent gate electrodes GE, and may be overlapped by the gate electrode GE. Also, it is possible to form an n-type semiconductor region serving as the source pull-out region SPR in the intermediate region TR. The source regions SR formed in the cell region CR are electrically coupled to the source pull-out region SPR formed in the intermediate region TR.

Subsequently, the interlayer insulation film IL is formed, which covers the gate electrode GE, the gate pull-out unit GPU, and the field plate electrode FFP. For example, a silicon oxide film is deposited on the gate electrode GE and the like by a CVD method. Then, a photoresist film (not shown) is formed on the interlayer insulation film IL, which has openings over a region where the body contact region BC is to be formed, the gate pull-out unit GPU, and the source pull-out region SPR. Then, the interlayer insulation film IL over the source region SR located between adjacent gate electrodes GE in the cell region CR is etched by using this photoresist film as mask. In this manner, the openings are formed. In this etching, overetching is performed in such a manner that the bottom of the opening is at a lower level than the surface of the epitaxial layer EPS. As a result, the source region SR is exposed from the side walls of the bottom of the opening. Also, an opening is also formed by etching the interlayer insulation film IL over the gate pull-out unit GPU and in the source pull-out region SPR in the intermediate region TR.

Then, a photoresist film is formed to cover the intermediate region TR and the peripheral region PER. With this photoresist film and the interlayer insulation film IL used as mask, impurity ions are implanted to form the body contact region BC. For example, p-type impurity ions, such as boron (B), are implanted as the impurity ions. In this manner, a p-type semiconductor region that serves as the body contact region BC can be formed. The body contact region BC is located in the central portion of the source region SR. The bottom of the body contact region BC reaches the channel region CH. The impurity concentration in the body contact region BC is higher than the impurity concentration in the channel region CH.

Figure 21:
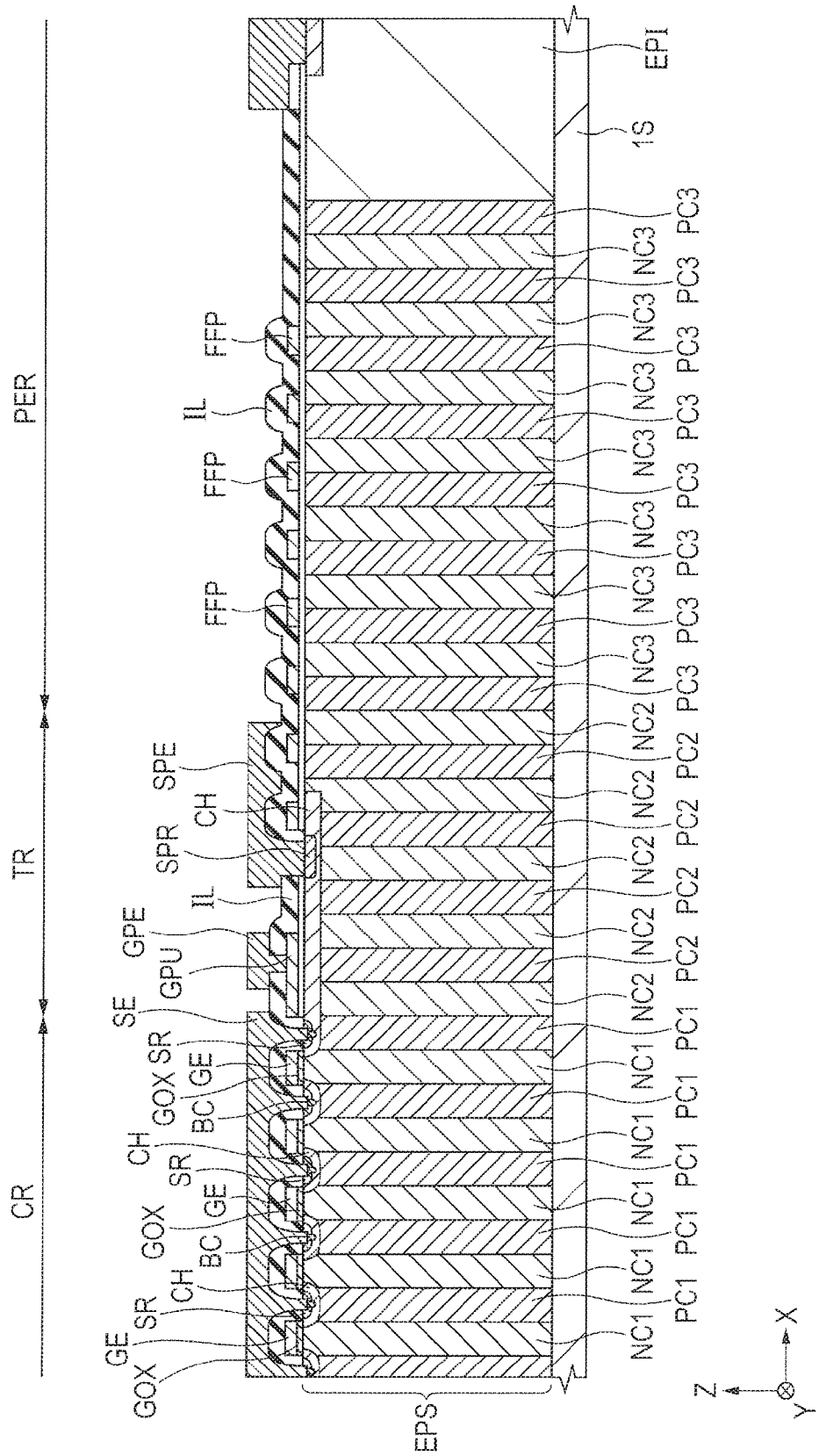
FIG. 21 is a cross-sectional view showing a manufacturing step of the semiconductor device according to the first embodiment, following FIG. 20.
Figure 22:
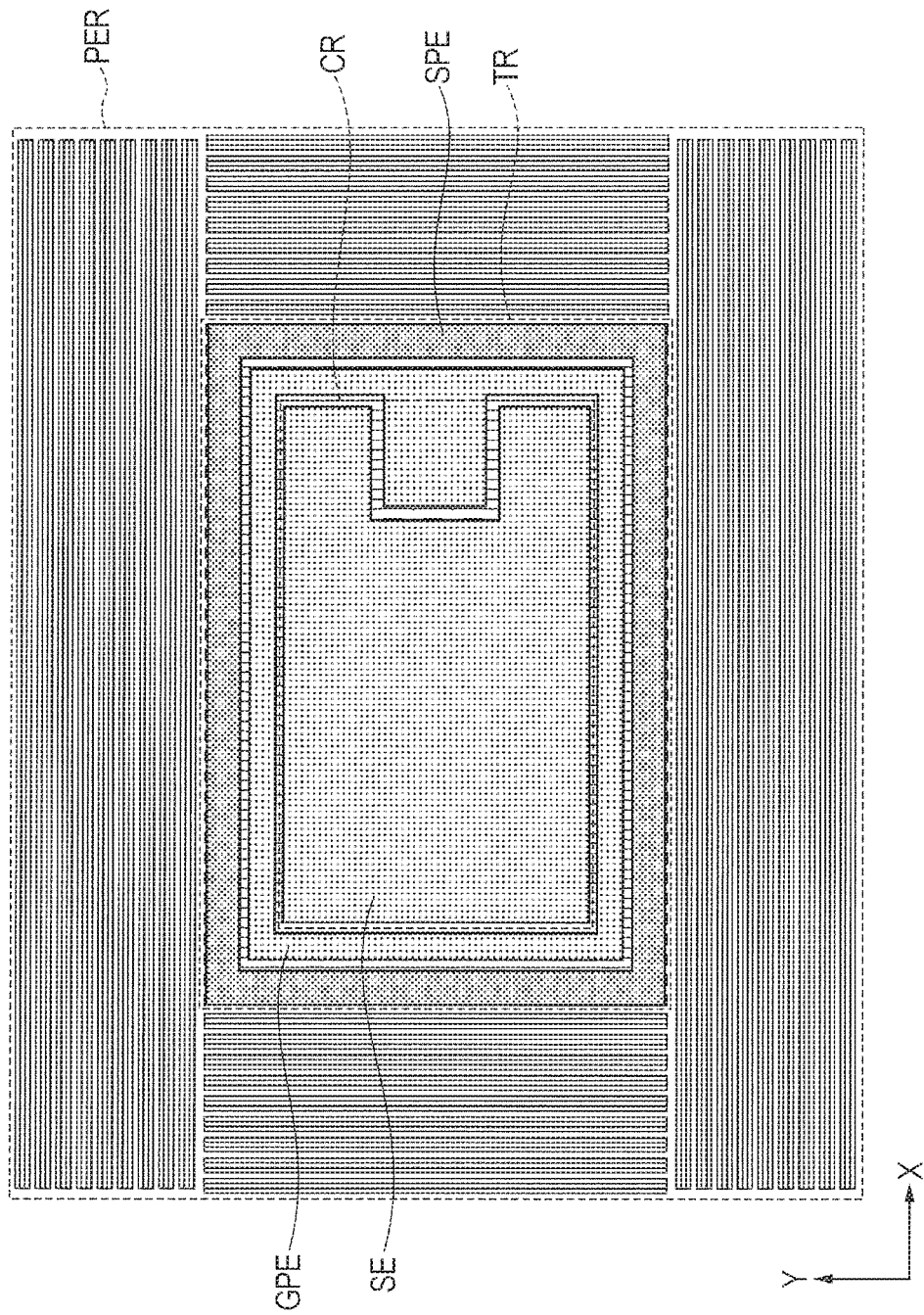
FIG. 22 is a plan view showing a manufacturing step of the semiconductor device according to the first embodiment.

Subsequently, the source electrode SE, the gate pull-out electrode GPE, and the source pull-out electrode SPE are formed, as shown in FIGS. 21 and 22. For example, a metal film is formed on the interlayer insulation film IL including portions on the body contact region BC, the gate pull-out unit GPU, and the source pull-out region SPR. For example, a multilayer film including a titanium tungsten film and its upper film, i.e., an aluminum film is formed by sputtering or the like. Then, the metal film is patterned, so that the source electrode SE, the gate pull-out electrode GPE, and the source pull-out electrode SPE are formed. The source electrode SE in the cell region CR is electrically coupled to the source region SR and the body contact region BC. The gate pull-out electrode GPE in the intermediate region TR is electrically coupled to the gate pull-out unit GPU. The source pull-out electrode SPE in the intermediate region TR is electrically coupled to the source pull-out region SPR.

Figure 23:
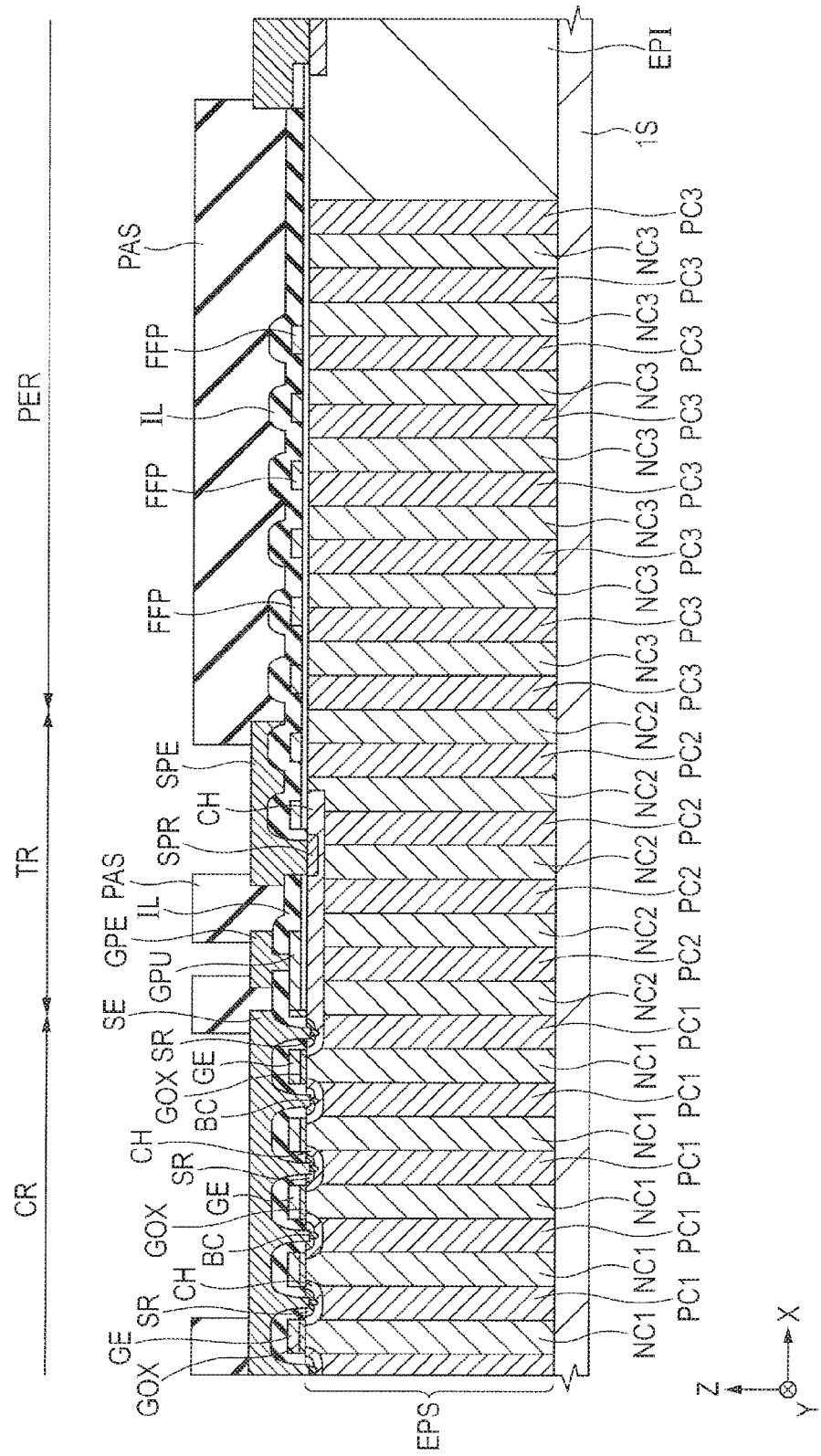
FIG. 23 is a cross-sectional view showing a manufacturing step of the semiconductor device according to the first embodiment, following FIG. 21.

Then, as shown in FIG. 23, the surface protective film PAS is formed to cover the source electrode SE, the gate pull-out electrode GPE, and the source pull-out electrode SPE. For example, a silicon oxide film is deposited on the source electrode, the gate pull-out electrode GPE, the source pull-out electrode SPE, and the like by a CVD method. The surface protective film PAS is then patterned, thereby a portion of the source electrode SE, a portion of the gate pull-out electrode GPE, and a portion of the source pull-out electrode SPE are exposed. These exposed portions serve as external connection regions (e.g., a gate pad and a source pad).

Figure 24:
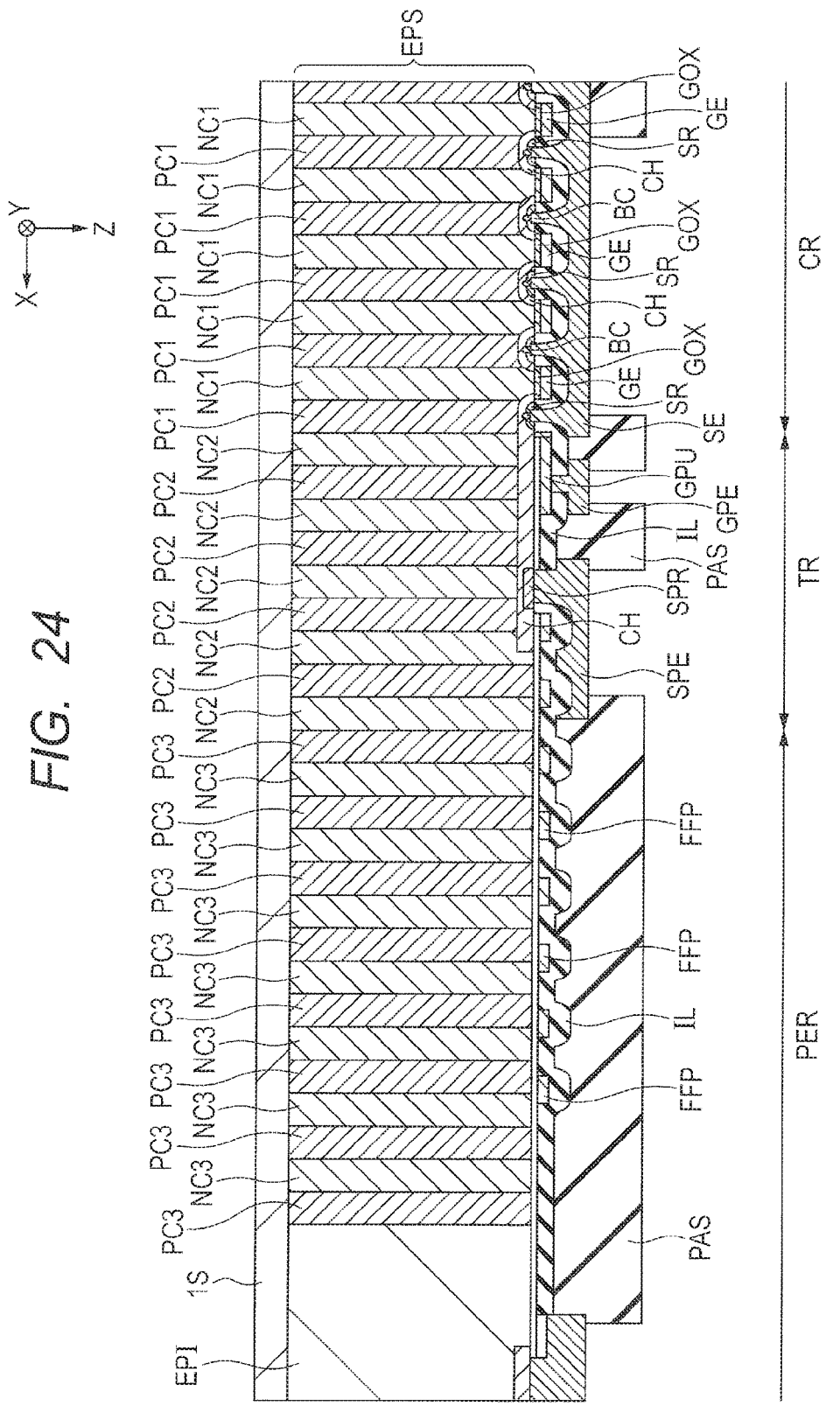
FIG. 24 is a cross-sectional view showing a manufacturing step of the semiconductor device according to the first embodiment, following FIG. 23.

As shown in FIG. 24, a back surface of the semiconductor substrate 1S, that is an opposite side (a groove-bottom side) of the major surface, is polished with the back surface facing up. For example, the back surface of the semiconductor substrate 1S is polished in such a manner that a total thickness of the semiconductor substrate 1S and the epitaxial layer EPS becomes about 50 to 60 μm. In this manner, the semiconductor substrate 1S is made thinner. As a result of this polishing, the distance between the back surface of the semiconductor substrate 1S and the bottom surfaces of the grooves (DT1, DT2, and DT3) become about 3 to 5 μm, for example.

Figure 25:
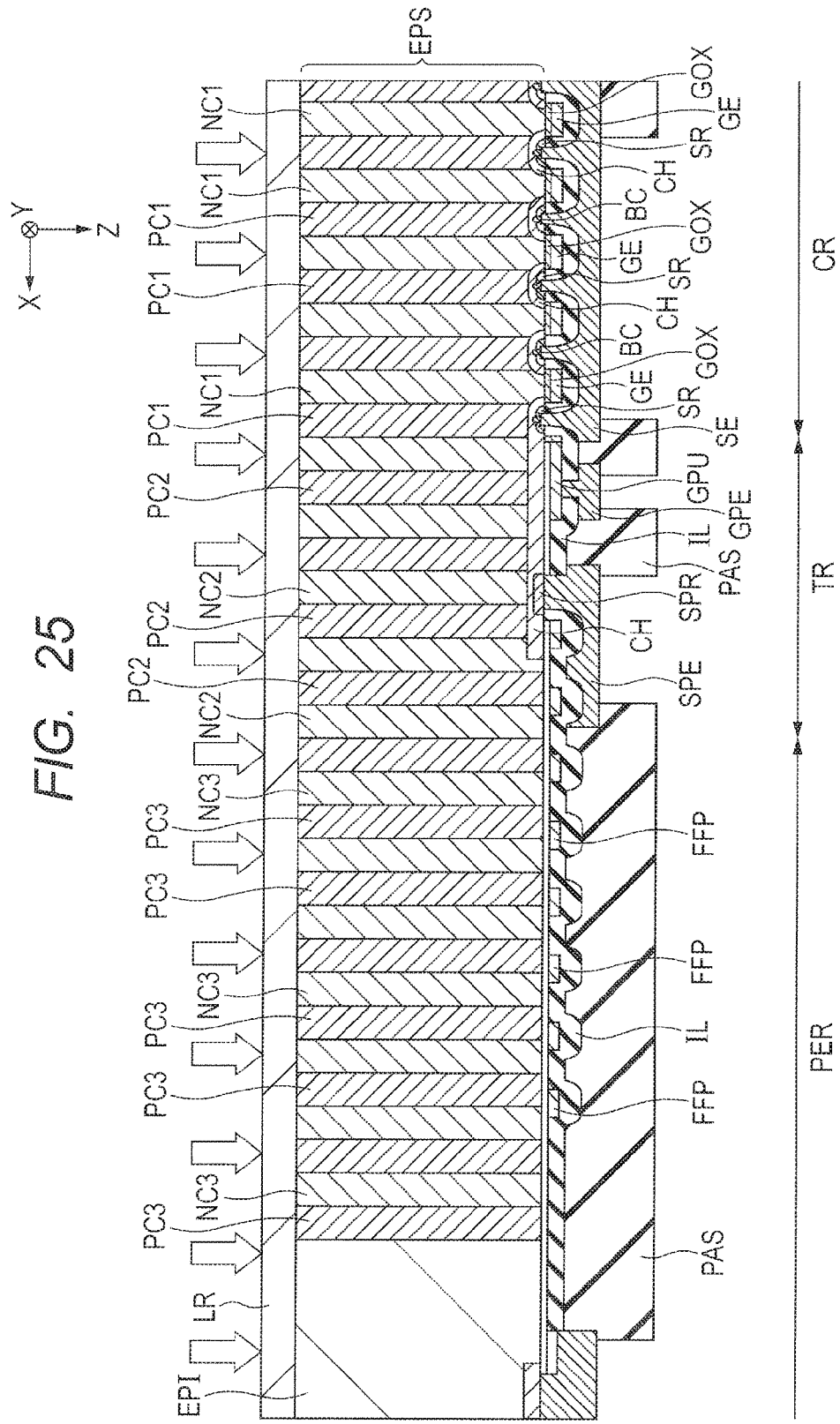
FIG. 25 is a cross-sectional view showing a manufacturing step of the semiconductor device according to the first embodiment, following FIG. 24.

Then, as shown in FIG. 25, n-type impurity ions are implanted into the entire back surface of the semiconductor substrate 1S, thereby forming an n-type semiconductor region (a low resistance region) LR. By forming the n-type semiconductor region LR in this manner, it is possible to reduce a resistance of coupling between the drain electrode DE described later and the n-type column region (NC1, NC2, or NC3). This n-type semiconductor region (the low resistance region) extends from the back surface of the semiconductor substrate 1S to the bottom of the grooves (DT1, DT2, and DT3), and has an n-type impurity concentration of about $1.0\times10^{16}/cm^3$ and a thickness of about 1 to 2 μm, for example.

Figure 26:
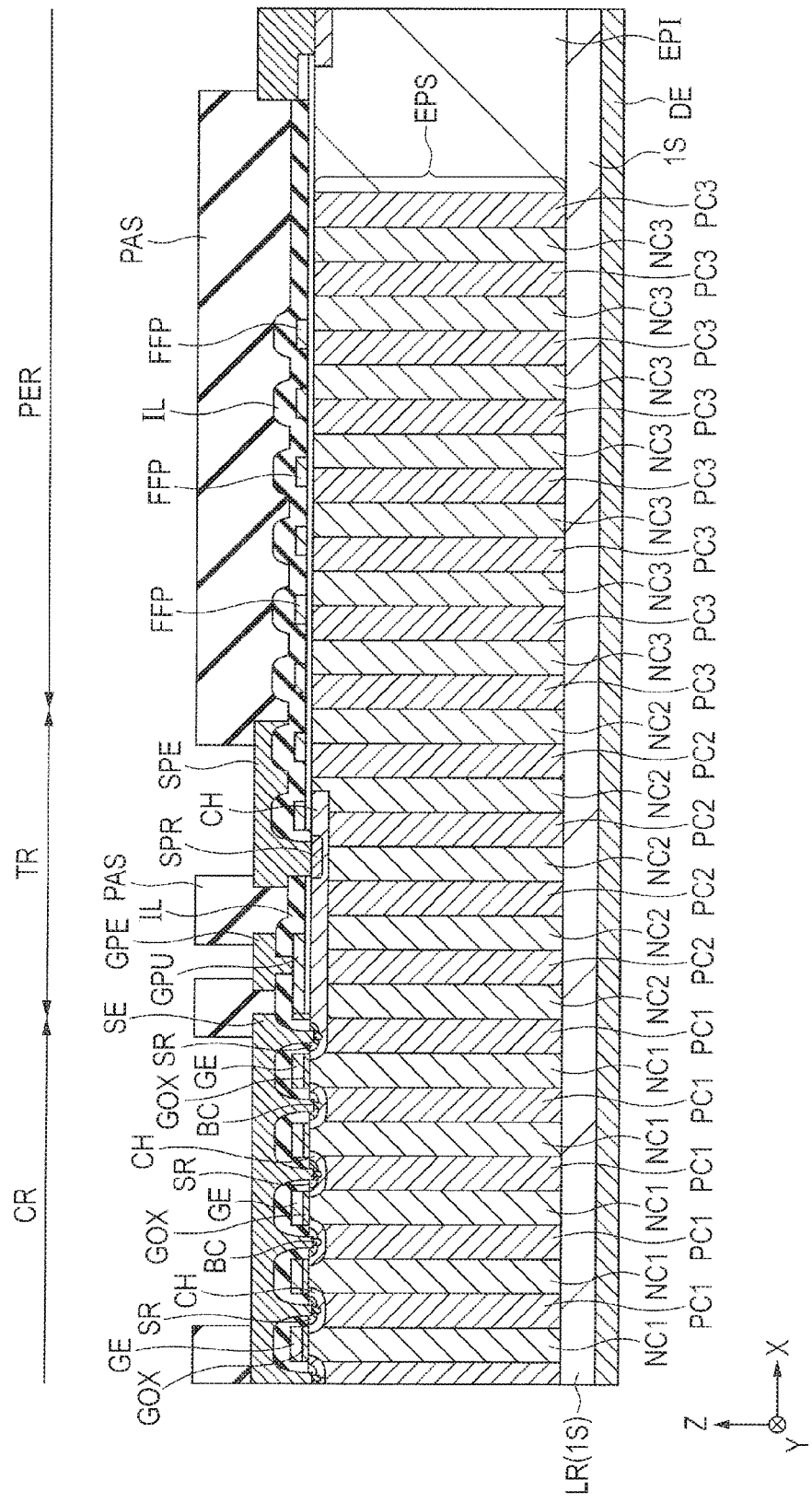
FIG. 26 is a cross-sectional view showing a manufacturing step of the semiconductor device according to the first embodiment, following FIG. 25.

Then, as shown in FIG. 26, the drain electrode DE is formed on the back surface of the semiconductor substrate 1S. For example, a metal film is formed by sputtering or vapor deposition with the back surface of the semiconductor substrate 1 facing up. In this manner, the drain electrode DE formed by the metal film can be formed.

By the above steps, the semiconductor device according to the present embodiment can be formed.

In a case where the p-type column regions (PC1, PC2, and PC3) and the n-type column regions (NC1, NC2, and NC3) are formed by a trench fill method as in the present embodiment, it is possible to reduce distances between the p-type column regions and the n-type column regions, as compared with a "multi-epitaxial method". This can reduce the on-state resistance and can improve the breakdown voltage. Further, the "trench fill method" is more advantageous than the "multi-epitaxial method" in terms of a throughput.

According to the present embodiment, the following features can be obtained.

By forming the defect region DF by radiation of ions of proton, helium or the like, it is possible to form the defect region DF selectively in the depth direction and the plane direction of the semiconductor substrate 1S or the epitaxial layer EPS.

Selective formation of the defect region DF at a deeper level than the channel region CH enables reduction of the leak current between the source and the drain of the vertical power MOSFET.

The defect region DF is selectively formed in the cell region CR by using the shielding mask M that exposes the cell region CR and covers the intermediate region TR and the peripheral region PER. Therefore, the breakdown voltage of the vertical power MOSFET can be improved.

The ion radiation step is performed prior to formation of the gate insulation film and the gate electrode of the vertical power MOSFET. Therefore, it is possible to prevent breakdown of the gate insulation film or an increase of the leak current, caused by charge-up of the gate electrode.

After ion radiation is performed, a thermal process step, e.g., the step of forming the epitaxial layer EP for forming the p-type column regions PC1, PC2, and PC3, or the step of forming the gate insulation film GOX, serves as annealing for recovering amorphousness by ion radiation. Therefore, the ion radiation amount can be increased. That is, the defect density in the defect region DF can be increased, so that the recovery characteristics of the built-in diode can be improved.

After ion radiation, the grooves DT1, DT2, and DT3 are formed in the semiconductor substrate 1S or the epitaxial layer EPI, and thereafter the epitaxial layer EPS is formed inside the grooves DT1, DT2, and DT3 to form the p-type column regions PC1, PC2, and PC3. Therefore, it is possible to form the p-type column regions PC1, PC2, and PC3 having no defect region DF. In other words, the interface having no defect region DF (few defect regions DF) can be formed at the boundaries between the p-type column regions PC1, PC2, and PC3 and the n-type column regions NC1, NC2, and NC3. Further, a process for reducing the defect density is performed for the side surfaces of the grooves DT1, DT2, and DT3 prior to formation of the epitaxial layer EPS. This enables formation of the pn junction having no defect region DF. Therefore, the leak current between the source and the drain in the vertical power MOSFET can be reduced.

Second Embodiment

The present embodiment is an example in which the p-type column regions PC1, PC2, and PC3 and the n-type column regions NC1, NC2, and NC3 are formed by a multi-epitaxial method in the first embodiment. The same parts as those in the first embodiment are labeled with the same or related reference signs, and the redundant description thereof is omitted.

In the present embodiment, the p-type column regions PC1, PC2, and PC3 are formed by a plurality of p-type semiconductor regions PSR stacked in the depth direction of the epitaxial layer EPS. In addition, the defect region DF is formed in the p-type column region PC1 and the n-type column region NC1 in the cell region CR.

Figure 27:
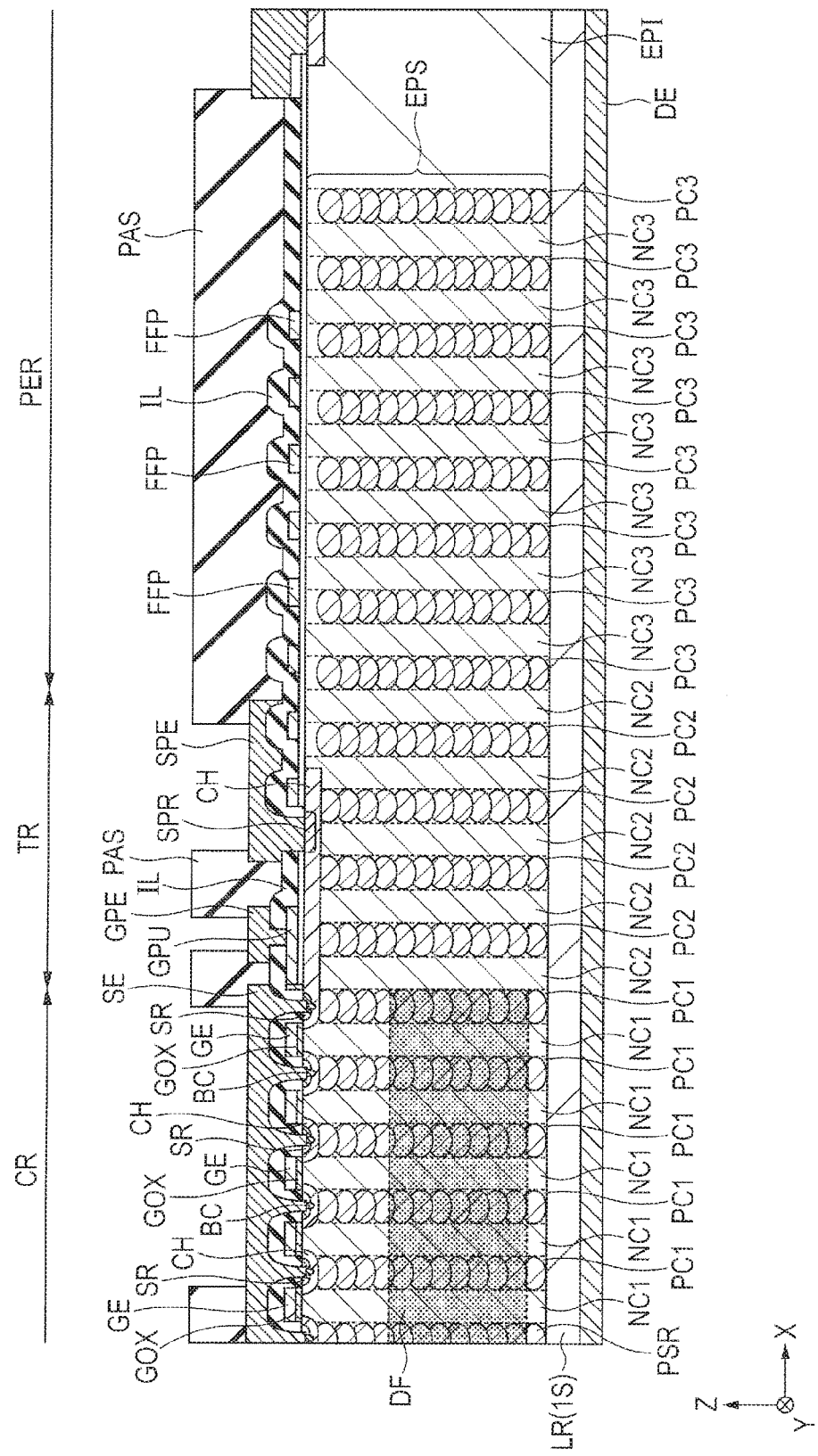
FIG. 27 is a cross-sectional view showing a configuration of a semiconductor device according to a second embodiment.

FIG. 27 is a cross-sectional view showing a configuration of a semiconductor device according to the present embodiment, and FIGS. 28 to 31 are cross-sectional views showing manufacturing steps according to the present embodiment.

As shown in FIG. 27, the p-type column regions PC1, PC2, and PC3 are formed by the p-type semiconductor regions PSR stacked in the depth direction (Z-direction) of the epitaxial layer EPS. The p-type semiconductor regions PSR are continuously formed from the n-type semiconductor region LR to the channel region CH. The p-type semiconductor regions PSR adjacent in Z-direction overlap each other.

The defect region DF is formed in the cell region CR, but is not formed in the intermediate region TR and the peripheral region PER. In the cell region CR, the defect region DF is formed in both the p-type column region PC1 and the n-type column region NC1. However, the defect region DF is formed at a deeper level than the channel region CH, but is not formed in and directly below the channel region CH as in the first embodiment. That is, the p-type channel region CH is in contact with the n-type column region NC1 having no defect region DF, to form a pn junction. Further, the p-type channel region CH is coupled to the p-type column region PC1 having no defect region DF.

Because the defect region DF is formed at a deeper level than the p-type channel region CH, the leak current between the source and the drain of the vertical power MOSFET can be reduced. In addition, the defect region DF is formed selectively in the cell region CR, but is not formed in the intermediate region TR and the peripheral region PER. Therefore, the breakdown voltage of the vertical power MOSFET can be improved. Note that the defect region DF can be formed in a portion of the intermediate region TR, as in the first embodiment.

Next, a manufacturing method of the semiconductor device according to the present embodiment is described.

Figure 28:
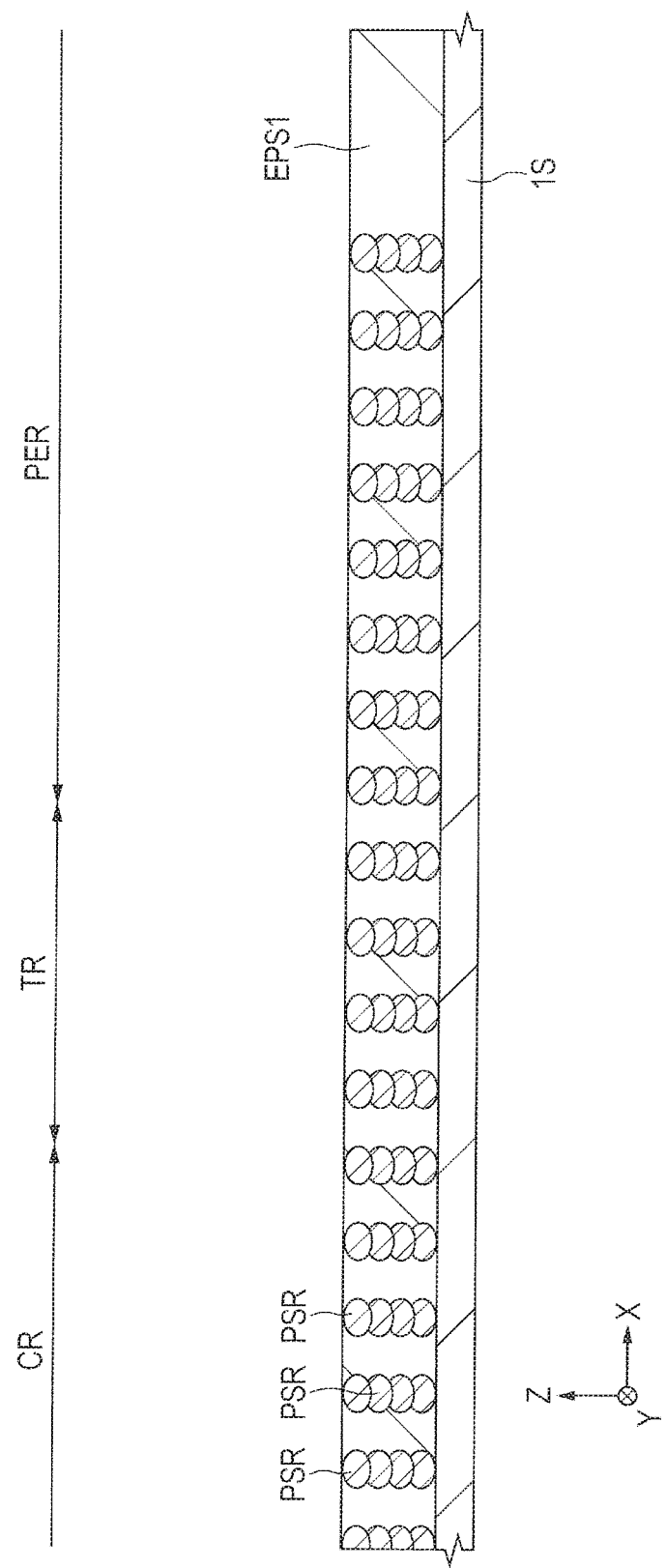
FIG. 28 is a cross-sectional view showing a manufacturing step of the semiconductor device according to the second embodiment.

As shown in FIG. 28, an epitaxial layer EPS1 is formed by an n-type semiconductor layer on the major surface of the semiconductor substrate 1S. Thereafter, a plurality of p-type semiconductor regions PSR that are stacked are formed by using a photoresist film (not shown) that exposes regions where the p-type column regions PC1, PC2, and PC3 are to be formed and covers other regions. Each of the p-type semiconductor regions PSR is formed by ion implantation of impurities, such as boron, while an ion implantation energy is changed, for example.

Figure 29:
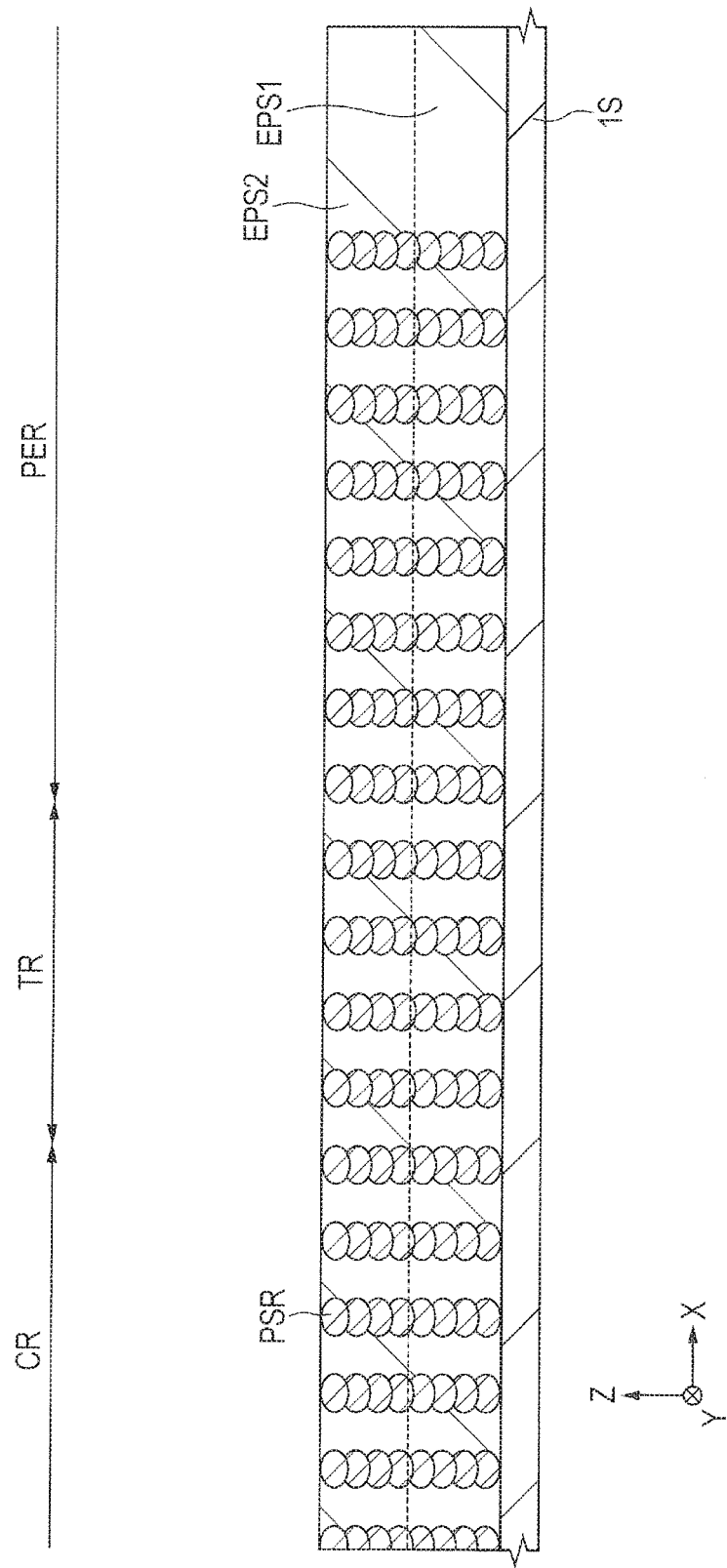
FIG. 29 is a cross-sectional view showing a manufacturing step of the semiconductor device according to the second embodiment, following FIG. 28.

After the photoresist film (not shown) is removed, an epitaxial layer EPS2 is formed by an n-type semiconductor layer over a major surface of the epitaxial layer EPS1, as shown in FIG. 29, and a plurality of p-type semiconductor regions PSR are formed by the same method as that described above.

Figure 30:
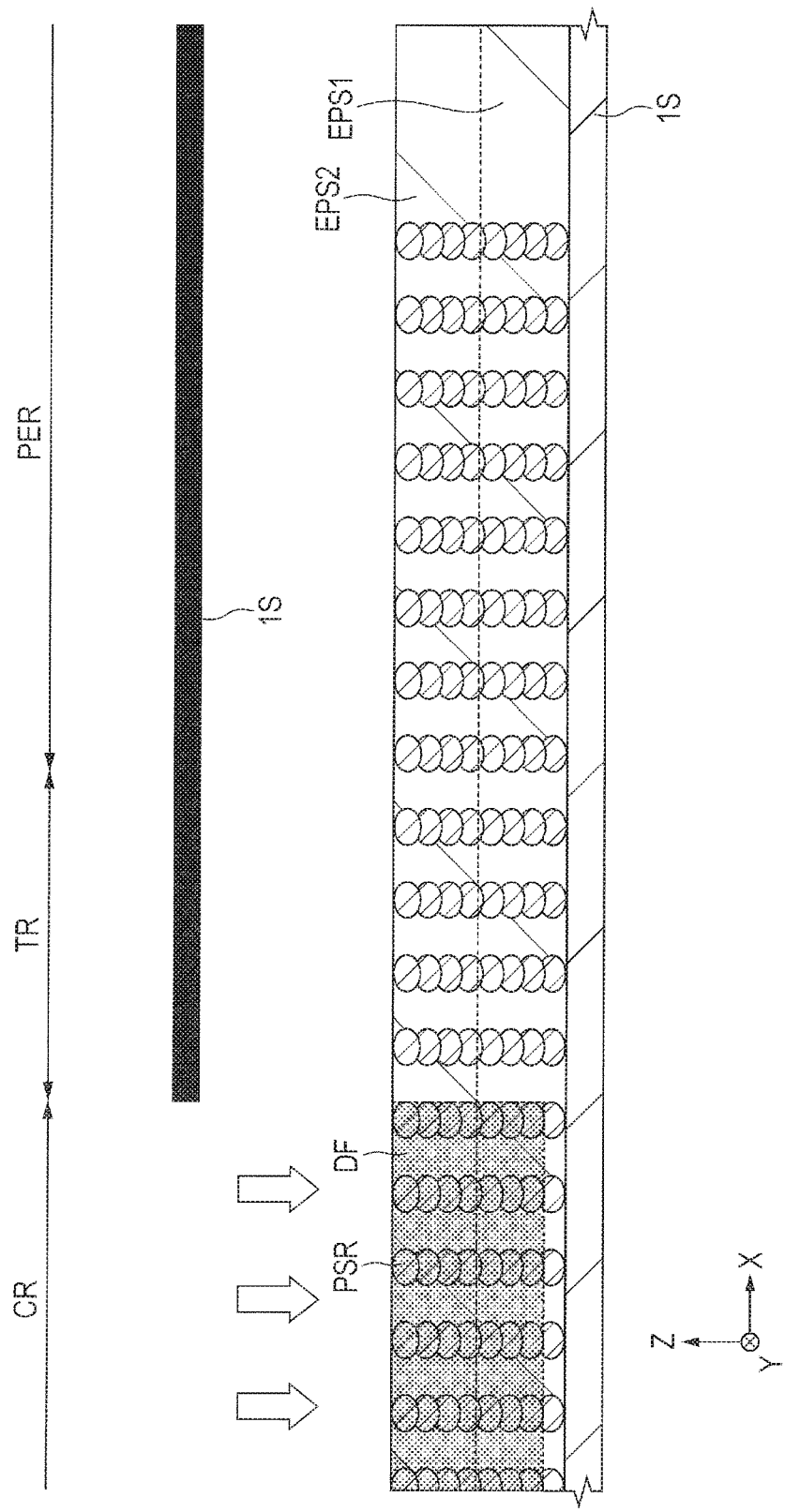
FIG. 30 is a cross-sectional view showing a manufacturing step of the semiconductor device according to the second embodiment, following FIG. 29.

Then, as shown in FIG. 30, ion radiation is performed for the epitaxial layers EPS2 and EPS1 by using the same shielding mask N and the same type of ions as those in the first embodiment. By this ion radiation, the defect regions DF are selectively formed in the cell region CR. No defect region DF is formed in the intermediate region TR and the peripheral region PER that are covered by the shielding mask M. Also in the present embodiment, the ion radiation amount, the resistivity, and the hole lifetime in the depth direction of the n-type column region NC1 are respectively the same as those shown in FIGS. 7A, 7B, and 7C.

Figure 31:
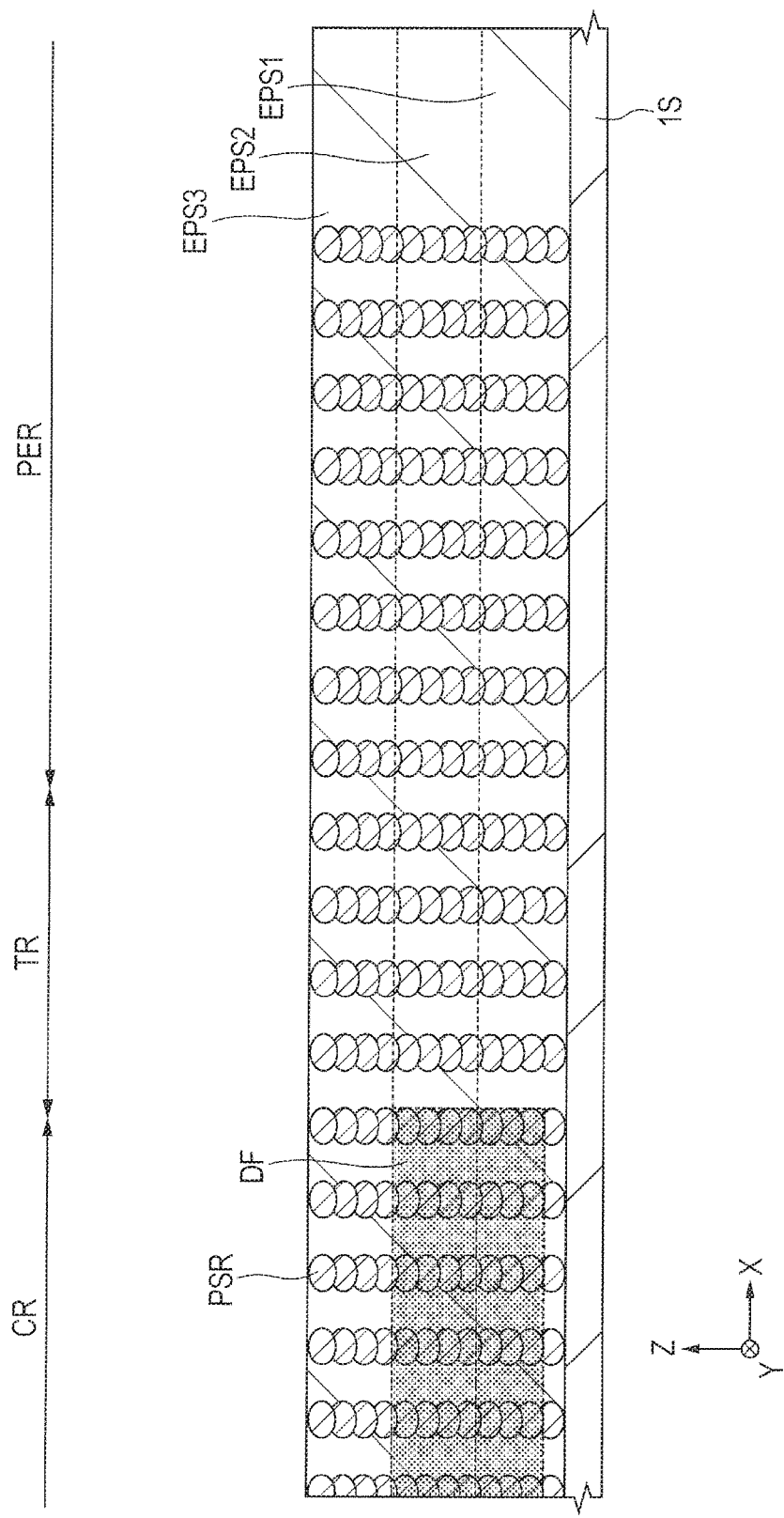
FIG. 31 is a cross-sectional view showing a manufacturing step of the semiconductor device according to the second embodiment, following FIG. 30.

Then, as shown in FIG. 31, an epitaxial layer EPS3 is formed by an n-type semiconductor layer on the major surface of the epitaxial layer EPS2, and a plurality of p-type semiconductor regions PSR are formed by the same method as that described above. No defect is formed inside the epitaxial layer EPS3 (in particular, on a top-surface side that is far from the epitaxial layer EPS2).

In this manner, the epitaxial layer EPS including the epitaxial layers EPS1, EPS2, and EPS3 is formed. In the epitaxial layer EPS, the p-type column regions PC1, PC2, and PC3 formed by the stacked p-type semiconductor regions PSR and the n-type column regions NC1, NC2, and NC3 are formed.

Then, the steps including the step of forming the channel region CH and its subsequent steps in the above-described first embodiment are performed. Consequently, the semiconductor device according to the present embodiment is completed.

According to the present embodiment, ion radiation is performed to form the defect regions DF, prior to formation of the epitaxial layer EPS in which the channel layer CH is formed. Due to this, no defect region DF is present in the interface between the channel region CH and the n-type column region NC1. Therefore, the leak current between the source and the drain of the vertical power MOSFET can be reduced.

Third Embodiment

Figure 32:
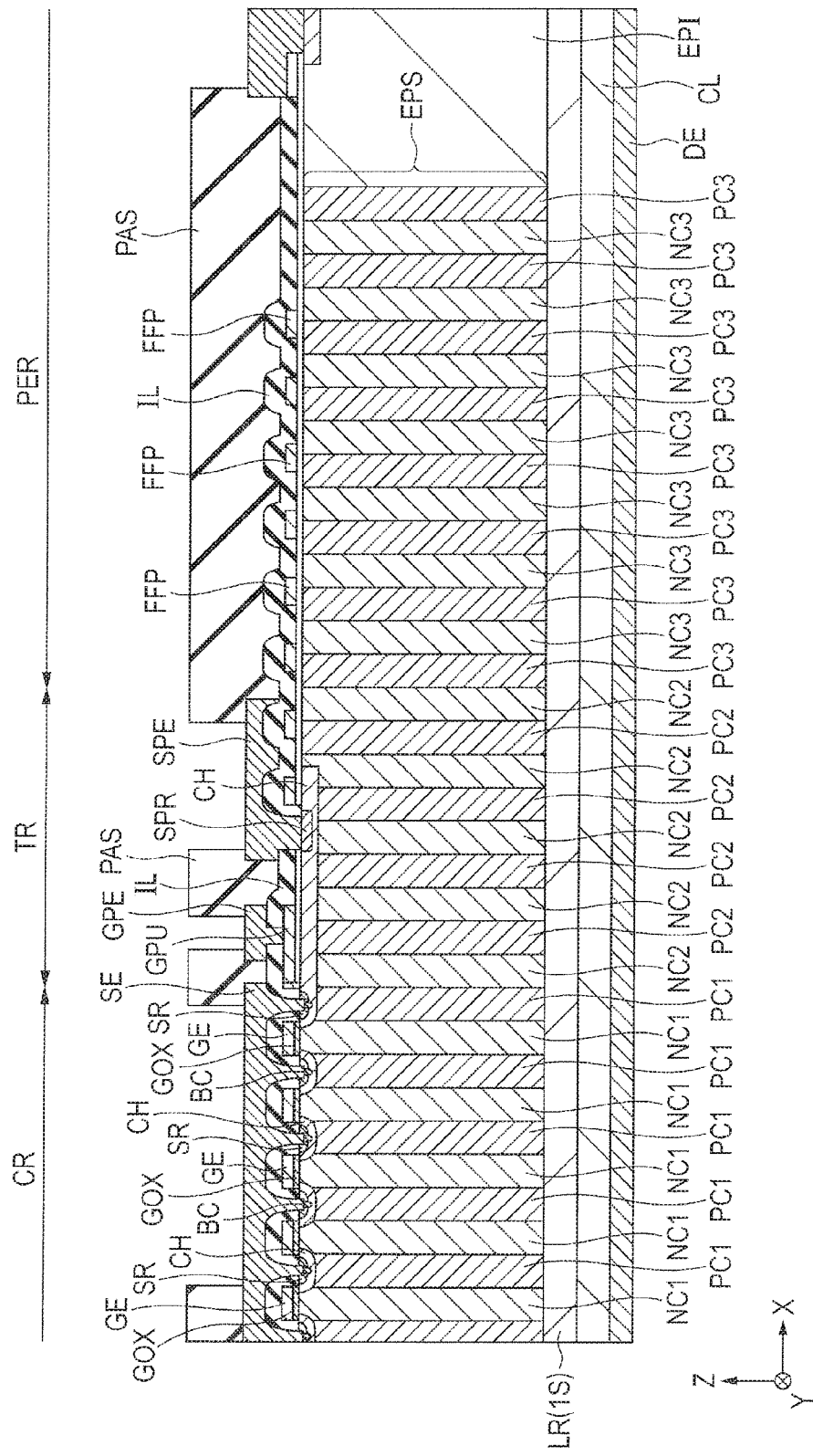
FIG. 32 is a cross-sectional view showing a configuration of a semiconductor device according to a third embodiment.

The present embodiment is an example in which the vertical power MOSFET according to the first embodiment is applied to an IGBT (Insulated Gate Bipolar Transistor). FIG. 32 is a cross-sectional view showing a configuration of a semiconductor device according to the present embodiment. The same parts as those in the first embodiment and the like are labeled with the same or related reference signs, and the redundant description thereof is omitted.

As shown in FIG. 32, a collector layer CL that is a p-type semiconductor region lies between the n-type semiconductor layer LR and the drain electrode DE. Because the present embodiment is the IGBT, the source electrode SE and the drain electrode DE in the first embodiment are read as an emitter electrode and a collector electrode, respectively.

Similarly, the structure of the vertical power MOSFET according to the second embodiment can be also applied to the IGBT.

Fourth Embodiment

Figure 33:
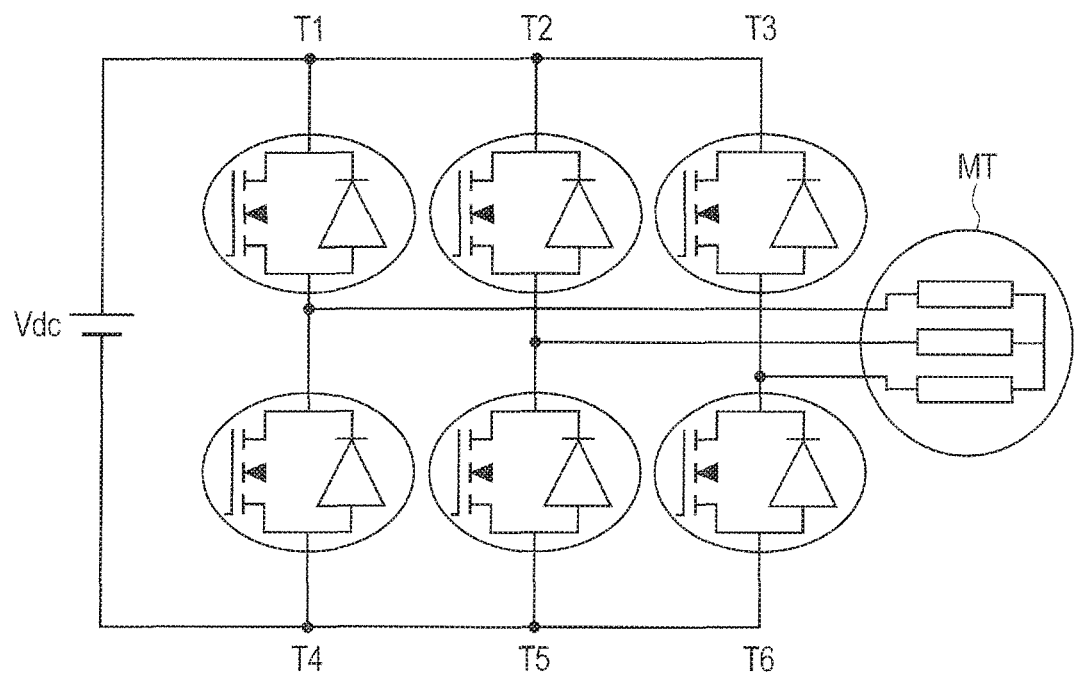
FIG. 33 shows a motor driving circuit according to a fourth embodiment.

The present embodiment is a system (a motor driving circuit) that uses the vertical power MOSFET according to the first embodiment. FIG. 33 shows the motor driving circuit according to the present embodiment.

As shown in FIG. 33, the motor driving circuit is formed by a power source Vdc, pairs of transistors coupled in series T1 and T4, T2 and T5, and T3 and T6, and a three-phase motor MT. Each of the pairs of transistors coupled in series T1 and T4, T2 and T5, and T3 and T6 forms an inverter. The three-phase motor MT is driven by respective outputs of the three inverters.

Although the transistors T1 to T6 are formed by the vertical power MOSFETs according to the first or second embodiment, they may be formed by the IGBTs according to the third embodiment.

In the above, the invention made by the inventors of the present application has been specifically described by way of the embodiments. However, It is naturally understood that the present invention is not limited to the above-described embodiments, and can be changed in various ways within the scope not departing from the gist thereof.

What is claimed is:

1. A semiconductor device comprising:
   a semiconductor layer including a first region and a second region that surrounds the first region in its major surface;
   a plurality of first column regions of a first conductivity type and a plurality of second column regions of a second conductivity type opposite to the first conductivity type, the first column regions and the second column regions being formed in the semiconductor layer in the first region;
   a plurality of third column regions of the first conductivity type and a plurality of fourth column regions of the second conductivity type that are formed in the semiconductor layer in the second region;
   a gate electrode formed above the first column region over the major surface of the semiconductor layer via a gate insulation film;
   a first semiconductor region of the second conductivity type formed at an end of the gate elect bode over the major surface of the semiconductor layer; and
   a second semiconductor region of the first conductivity type formed over the major surface of the semiconductor layer to be located above the second column region, include therein the first semiconductor region, and extend below the gate electrode,
   wherein the first column regions and the second column regions are alternately arranged in the first region,
   wherein the third column regions and the fourth column regions are alternately arranged in the second region, and
   wherein the first column region has a defect region, and a defect density in the first column region is larger than a defect density in the third column region.

2. The semiconductor device according to claim 1, wherein the defect density in the first column region is larger than a defect density in the second column region.

3. The semiconductor device according to claim 1, wherein the defect region in the first column region is deeper than an interface between the second semiconductor region and the first column region.

4. The semiconductor device according to claim 1, wherein a hole lifetime in the first column region is shorter than a hole lifetime in the third column region.

5. The semiconductor device according to claim 1, wherein a resistivity of the first column region is larger than a resistivity of the third column region.

6. The semiconductor device according to claim 5, wherein the resistivity of the first column region is larger than a resistivity of the second column region.

7. The semiconductor device according to claim 1, further comprising:
   a third semiconductor region of the second conductive type, formed over the major surface of the semiconductor layer to extend through the first semiconductor region and reach the second semiconductor region, and
   a first electrode coupled to the first semiconductor region and the third semiconductor region.

8. The semiconductor device according to claim 7, further comprising:
   a fourth semiconductor region of the first conductive type that is in contact with lower ends of the first and second column regions, and
   a second electrode coupled to the fourth semiconductor region.

9. The semiconductor device according to claim 1, wherein the second column regions are formed by a plurality of stacked fifth semiconductor regions of the second conductive type.

10. A manufacturing method of a semiconductor device, comprising the steps of:
    (a) preparing a first semiconductor layer of a first conductive type that includes a first region and a second region surrounding the first region in its major surface;
    (b) performing on radiation using a mask that exposes the first region and covers the second region, to form a defect region in the first semiconductor layer;
    (c) forming a plurality of grooves in the first semiconductor layer in the first region and the second region;
    (d) embedding inside of the grooves with a second semiconductor layer of a second conductivity type opposite to the first conductivity type, to form a third semiconductor layer in which a first column region of the first conductivity type and a second column region of the second conductivity type are alternately arranged in the first region and a third column region of the first conductivity type and a fourth column region of the second conductivity type are alternately arranged in the second region;
    (e) forming a first semiconductor region of the second conductivity type in a major surface of the third semiconductor layer;

(f) forming a gate electrode above the first column region over the major surface of the third semiconductor layer via a gate insulation film; and (g) forming a second semiconductor region of the first conductivity type over the major surface of the third semiconductor layer in the first semiconductor region, wherein a defect density in the first column region is larger than a defect density in the third column region.

11. The manufacturing method of the semiconductor device according to claim 10, wherein the first semiconductor region extends below the gate electrode and has a pn junction with the first column region, and wherein the defect region is deeper than the pn junction.

12. The manufacturing method of the semiconductor device according to claim 10, further comprising performing hydrogen baking for inner walls of the grooves prior to the step (d).

13. The manufacturing method of the semiconductor device according to claim 10, wherein ion radiation of proton or helium is performed in the step (b).

14. The manufacturing method of the semiconductor device according to claim 10, wherein the defect density in the first column region is larger than a defect density in the second column region.

15. A manufacturing method of a semiconductor device, comprising the steps of:

(a) preparing a first semiconductor layer of a first conductivity type including a first region and a second region on its first major surface;

(b) forming a first semiconductor region of a second conductivity type opposite to the first conductivity type in the first region and the second region of the first semiconductor layer, and a second semiconductor region of the second conductivity type that is located over the first semiconductor region and is in contact with the first semiconductor region;

(c) performing ion radiation selectively for the first region by using a mask that exposes the first region and covers the second region, to form a defect region in the first semiconductor layer;

(d) forming a second semiconductor layer of the first conductivity type over the first major surface of the first semiconductor layer;

(e) forming a third semiconductor region of the second conductivity type in the second semiconductor layer, which is located over the second semiconductor region in the first region and the second region and is in contact with the second semiconductor region;

(f) forming a fourth semiconductor region of the second conductivity type that is in contact with the third semiconductor region, is formed over the third semiconductor region, and reaches a second major surface of the second semiconductor layer in the first region;

(g) forming a gate electrode over the second major surface of the second semiconductor layer via a gate insulation film in the first region, and (h) forming a fifth semiconductor region of the first conductivity type at an end of the gate electrode in the second major surface of the second semiconductor layer in the fourth semiconductor region.

* * * * *